US008823687B2

(12) United States Patent
Kitamura et al.

(10) Patent No.: US 8,823,687 B2
(45) Date of Patent: Sep. 2, 2014

(54) SIGNAL LINE DRIVE CIRCUIT, DISPLAY DEVICE AND ELECTRONIC APPARATUS

(75) Inventors: Ken Kitamura, Kanagawa (JP); Masaki Yoshioka, Kanagawa (JP); Yoshimasa Serizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 895 days.

(21) Appl. No.: 12/923,331

(22) Filed: Sep. 15, 2010

(65) Prior Publication Data

US 2011/0128271 A1 Jun. 2, 2011

(30) Foreign Application Priority Data

Nov. 30, 2009 (JP) ................................ 2009-272724

(51) Int. Cl.

| | |
|---|---|
| ***G06F 3/038*** | (2013.01) |
| ***G09G 5/00*** | (2006.01) |
| ***G09G 3/36*** | (2006.01) |
| ***G11C 19/00*** | (2006.01) |

(52) U.S. Cl.

CPC ............ *G09G 3/3607* (2013.01); *G09G 3/3648* (2013.01); *G09G 3/3696* (2013.01); *G09G 2310/0297* (2013.01); *G09G 3/3688* (2013.01); *G09G 3/3614* (2013.01); *G09G 2300/0426* (2013.01); *G09G 2300/0804* (2013.01)

USPC ............. 345/204; 345/87; 345/211; 345/212; 345/213; 377/64

(58) Field of Classification Search

USPC ................... 345/87–104, 204–215, 690–699; 377/64–81

See application file for complete search history.

(56) References Cited

U.S. PATENT DOCUMENTS

| | | | | |
|---|---|---|---|---|
| 7,286,125 | B2 * | 10/2007 | Morita | 345/211 |
| 7,567,244 | B2 * | 7/2009 | Nohtomi et al. | 345/204 |
| 7,683,873 | B2 * | 3/2010 | Okamura et al. | 345/98 |
| 7,764,258 | B2 * | 7/2010 | Kitamura et al. | 345/96 |
| 2006/0022925 | A1 * | 2/2006 | Hara et al. | 345/89 |
| 2006/0044301 | A1 * | 3/2006 | Ha | 345/209 |
| 2006/0262073 | A1 * | 11/2006 | Sekine et al. | 345/100 |
| 2007/0242025 | A1 * | 10/2007 | Lim | 345/100 |
| 2008/0204439 | A1 * | 8/2008 | Morita | 345/209 |
| 2009/0009446 | A1 * | 1/2009 | Kamijo et al. | 345/87 |
| 2009/0295777 | A1 * | 12/2009 | Wang | 345/212 |
| 2009/0309857 | A1 * | 12/2009 | Nishimura | 345/205 |
| 2011/0141098 | A1 * | 6/2011 | Yaguma et al. | 345/212 |

FOREIGN PATENT DOCUMENTS

| | | |
|---|---|---|
| JP | 09-026765 | 1/1997 |
| JP | 10-153986 | 6/1998 |

* cited by examiner

*Primary Examiner* — Jason Olsen
*Assistant Examiner* — Stephen T Reed
(74) *Attorney, Agent, or Firm* — Rader, Fishman & Grauer PLLC

(57) ABSTRACT

Disclosed herein is a signal line drive circuit including: a positive voltage supply section; a negative voltage supply section; line buffers; a positive selector; a negative selector; and an output selector, wherein the positive selector is arranged on one side, the negative selector on other side, the positive voltage supply section on the one side, and the negative voltage supply section on the other side, in such a manner that they are symmetrical with respect to the line buffers.

19 Claims, 26 Drawing Sheets

Background Art

Background Art

Background Art

NMOS REGION ONLY 542
541

542
543
541

541
547
543
545
546

541
542

541
542

500D
541
544
542

SIGNAL LINE DRIVE CIRCUIT, DISPLAY DEVICE AND ELECTRONIC APPARATUS

BACKGROUND OF THE INVENTION

1. Field of the Invention

The present invention relates to a signal line drive circuit in an active matrix display device such as liquid crystal display device, display device and electronic apparatus.

2. Description of the Related Art

An image display device such as liquid crystal display device has a number of pixels arranged in a matrix form and displays an image by controlling the light intensity of each of the display cells (pixels) according to image information to be displayed.

Recent years have seen remarkable development of liquid crystal display devices and remarkable progress in their performance. Such display devices are applicable to electronic apparatuses designed to display an image or video of a video signal externally fed to or generated inside the electronic apparatus. Among examples of such electronic apparatus are television sets, mobile terminals such as mobile phones and PDAs (Personal Digital Assistants), digital cameras, laptop personal computers and video camcorders.

FIG. 1 is a diagram illustrating a rough configuration of a common liquid crystal display device.

A liquid crystal display device 1 includes an effective display section 2. The same section 2 includes a plurality of pixels, each having a liquid crystal cell, arranged in a matrix form on a transparent insulating substrate such as a glass substrate as illustrated in FIG. 1.

The liquid crystal display device 1 also includes a signal line drive circuit (horizontal drive circuit or source driver: HDRV) 3 adapted to drive signal lines and a gate line drive circuit (vertical drive circuit or gate driver: VDRV) 4.

The effective display section 2 includes a plurality of pixels, each having an unshown liquid crystal cell, arranged in a matrix form.

Further, the same section 2 includes signal lines and gate lines (vertical scan lines) disposed in a matrix form. The signal lines and gate lines are driven by the signal line drive circuit 3 and gate line drive circuit 4, respectively.

In a liquid crystal display device, an AC voltage must be applied to the liquid crystal to prevent degradation of the liquid crystal molecules. In a common crystal display device, a so-called polarity inversion method based on either common constant driving or common reversed driving is used in which an AC voltage (common voltage) is applied to the liquid crystal.

The common constant driving alternately applies two voltages, one positive and another negative, relative to the opposed electrode voltage, to the pixel electrode while at the same time maintaining the opposed electrode voltage constant.

The common reversed driving alternately applies two voltages, one positive and another negative relative to the opposed electrode voltage, to the pixel electrode while at the same reversing the opposed electrode voltage between high and low levels.

In this case, when the opposed electrode voltage is at high level, a negative voltage relative to this high level is applied to the pixel electrode. When the opposed electrode voltage is at low level, a positive voltage relative to this low level is applied to the pixel electrode.

The signal line drive circuit 3 is configured to handle this polarity reversal.

A multi-channel driver is commonly available for use in the signal line drive circuit 3 (refer to Japanese Patent Laid-Open No. Hei 9-26765).

Further, the signal line drive circuit 3 uses analog buffers with rail-to-rail outputs in its output buffer section (refer to CMOS Circuit Design, Layout and Simulation P661 FIG. 25. 49, R. Jacob, Baker Harry, W. LI David E. Boyce) or output selectors with switches (refer to Japanese Patent Laid-Open No. Hei 10-153986) to achieve polarity reversal.

FIG. 2 is a block diagram illustrating a configuration example of a common signal line drive circuit using output selectors.

The signal line drive circuit 3 includes a line buffer (LB) 31 and level shifter (LS) 32. The line buffer 31 stores drive data adapted to drive the signal lines. The level shifter 32 changes the data level of the line buffer 31 to a level commensurate with the drive level.

The same circuit 3 further includes a positive voltage supply section 36P and negative voltage supply section 36N each using a resistor string.

The signal line drive circuit 3 still further includes a selector section 33. The selector section 33 includes a plurality of digital/analog converters (DACs) adapted to receive positive and negative gray level voltages and convert digital drive data into analog data. The selector section 33 includes positive and negative selectors 33P and 33N.

The signal line drive circuit 3 still further includes a buffer amplifier section 34. The buffer amplifier section 34 amplifies the drive data output from the selector section 33 to generate positive and negative signal voltages. The same section 34 includes positive and negative buffer amplifiers 34P and 34N.

The signal line drive circuit 3 still further includes output selectors 35. Each of the output selectors 35 selectively switches signal voltages between positive and negative levels and supplies the voltages to signal lines adjacent to each other.

There is not much literature about the component layout of a multi-channel signal line drive circuit as shown in the block diagram of FIG. 2. In general, however, the circuit components are laid out in the same manner as in the block diagram.

FIG. 3 is a diagram illustrating the component layout of a common four-channel signal line drive circuit unit.

For example, in order to lay out the components of a four-channel (Ch) unit 40 as illustrated in FIG. 3, the line buffers 31 adapted to distribute digital signals of different channels are arranged first, followed by the level shifters 32.

Next, a positive selector 33P-1, negative selectors 33N-1 and 33N-2 and a positive selector 33P-2 are arranged in this order from left to right as illustrated in FIG. 3.

Next, a combined circuit 34PN is arranged which is a combination of the positive and negative buffer amplifiers 34P and 34N. Finally, the output selectors 35 are arranged that are adapted to switch the signals between positive and negative levels. The output wires from the output selectors are extended to the output pads of the respective channels.

SUMMARY OF THE INVENTION

The drawback to the above four-channel unit is that the positive selectors 33P and negative selectors 33N are arranged alternately side by side every two channels. In the example shown in FIG. 3, the one positive selector 33P, two negative selectors 33N and one positive selector 33P are arranged in this order.

The positive selectors each include PMOS transistors. The negative selectors each include NMOS transistors.

Because no transistors Tr can be formed near the boundary of the well between the PMOS and NMOS transistors, a space SPC occurs between the positive selector 33P and negative selector 33N.

Wires from the voltage supply sections 36 are also a problem.

Wires run above the positive and negative selectors 33P and 33N from the voltage supply sections 36 to the positive and negative sides.

Therefore, although output voltages VN from the negative voltage supply section 36N are essentially not used for the positive selectors 33P-1 and 33P-2, the wires therefore pass above the same selectors 33P-1 and 33P-2.

Conversely, although output voltages VP from the positive voltage supply section 36P are essentially not used for the negative selectors 33N, the wires therefor pass above the same selectors 33N.

If the transistors Tr of the selectors are further reduced in size, the unused wires become larger in area than the transistors Tr, thus creating a region where there are only wires.

Next, problems will be demonstrated which arise if the units are arranged repeatedly over the entire chip first, after which output pads are arranged.

The number of output channels of the drivers per chip tends to increase in order to reduce the parts count of the panel module. For example, this number has increased to 960 channels.

FIG. 4 is a diagram illustrating a layout example in which the unit shown in FIG. 3 is arranged repeatedly in a single stage configuration.

The problem with the single stage configuration is that output pads 41 must be arranged under the chip in order to arrange a number of the same pads 41.

However, the outputs of the units are located at the top. Therefore, wires must be extended to the output pads provided under the chip.

This produces 'output wires only' portions 42, one on each edge of the chip as illustrated in FIG. 4, thus resulting in increased chip area.

FIG. 5 is a diagram illustrating a layout example in which the unit shown in FIG. 3 is arranged repeatedly in a two-stage configuration.

The problem with the two-stage configuration is that as the number of channels increases, it becomes impossible to arrange pads.

Assuming that the same units 40 are used in the single- and two-stage configurations, the chip area is more or less the same.

In this case, the single-stage configuration is more rectangular than the two-stage configuration. Therefore, the single-stage configuration has a longer perimeter.

As a result, in the two-stage configuration having a longer perimeter, the output pads no longer fit within the area enclosed by the perimeter as shown by reference numeral 43 in FIG. 5.

It is desirable to provide a signal line drive circuit and display device and electronic apparatus using the same that provide reduced useless space of well and useless routing of wires and smaller wire region, thereby contributing to reduced element size (layout area).

A signal line drive circuit according to a first embodiment of the present invention includes positive and negative voltage supply sections, line buffers, positive and negative selectors and output selector. The positive voltage supply section supplies a plurality of positive voltages. The negative voltage supply section supplies a plurality of negative voltages. The line buffers distribute an input digital signal to positive and negative sides. The positive selector selects a voltage level from among a plurality of voltage levels supplied from the positive voltage supply section according to the digital signal supplied from one of the line buffers. The negative selector selects a voltage level from among a plurality of voltage levels supplied from the negative voltage supply section according to the digital signal supplied from one of the line buffers. The output selector can switch the voltages selected by the positive and negative selectors between positive and negative levels for output to signal lines. The positive selector is arranged on one side, the negative selector on other side, the positive voltage supply section on the one side, and the negative voltage supply section on the other side, in such a manner that they are symmetrical with respect to the line buffers.

A display device according to a second embodiment of the present invention includes a display section and signal line drive circuits. The display section has display cells arranged in a matrix form. The display cells are driven by reversing the polarity. Each of the signal line drive circuits supplies a positive or negative signal voltage to each of signal lines connected to the display cells in response to the polarity reversal. Each of the signal line drive circuits includes positive and negative voltage supply sections, line buffers, positive and negative selectors and output selector. The positive voltage supply section supplies a plurality of positive voltages. The negative voltage supply section supplies a plurality of negative voltages. The line buffers distribute an input digital signal to positive and negative sides. The positive selector selects a voltage level from among a plurality of voltage levels supplied from the positive voltage supply section according to the digital signal supplied from one of the line buffers. The negative selector selects a voltage level from among a plurality of voltage levels supplied from the negative voltage supply section according to the digital signal supplied from one of the line buffers. The output selector can switch the voltages selected by the positive and negative selectors between positive and negative levels for output to the signal lines. The positive selector is arranged on one side, the negative selector on other side, the positive voltage supply section on the one side, and the negative voltage supply section on the other side, in such a manner that they are symmetrical with respect to the line buffers.

An electronic apparatus according to a third embodiment of the present invention includes a display device. The display device includes a display section and signal line drive circuits. The display section has display cells arranged in a matrix form. The display cells are driven by reversing the polarity. Each of the signal line drive circuits supplies a positive or negative signal voltage to each of signal lines connected to the display cells in response to the polarity reversal. Each of the signal line drive circuits includes positive and negative voltage supply sections, line buffers, positive and negative selectors and output selector. The positive voltage supply section supplies a plurality of positive voltages. The negative voltage supply section supplies a plurality of negative voltages. The line buffers distribute an input digital signal to positive and negative sides. The positive selector selects a voltage level from among a plurality of voltage levels supplied from the positive voltage supply section according to the digital signal supplied from one of the line buffers. The negative selector selects a voltage level from among a plurality of voltage levels supplied from the negative voltage supply section according to the digital signal supplied from one of the line buffers. The output selector can switch the voltages selected by the positive and negative selectors between positive and negative levels for output to the signal lines. The positive selector is arranged on one side, the negative selector on other side, the positive voltage supply section on the one side, and the negative voltage supply section on the other side, in such a manner that they are symmetrical with respect to the line buffers.

The present invention contributes to reduced useless well space, useless routing of wires and smaller wire region, thereby contributing to reduced element size (layout area).

DETAILED DESCRIPTION OF THE PREFERRED EMBODIMENT

A detailed description will be given below of an embodiment of the present invention with reference to the accompanying drawings. It should be noted that the description will be given in the following order:

1. Configuration Example of the Display Device
2. First Configuration Example of the Signal Line Drive Circuit
3. Second Configuration Example of the Signal Line Drive Circuit
4. Third Configuration Example of the Signal Line Drive Circuit
5. Configuration Examples of Electronic Apparatus <1. Configuration Example of the Display Device>

Figure 6:
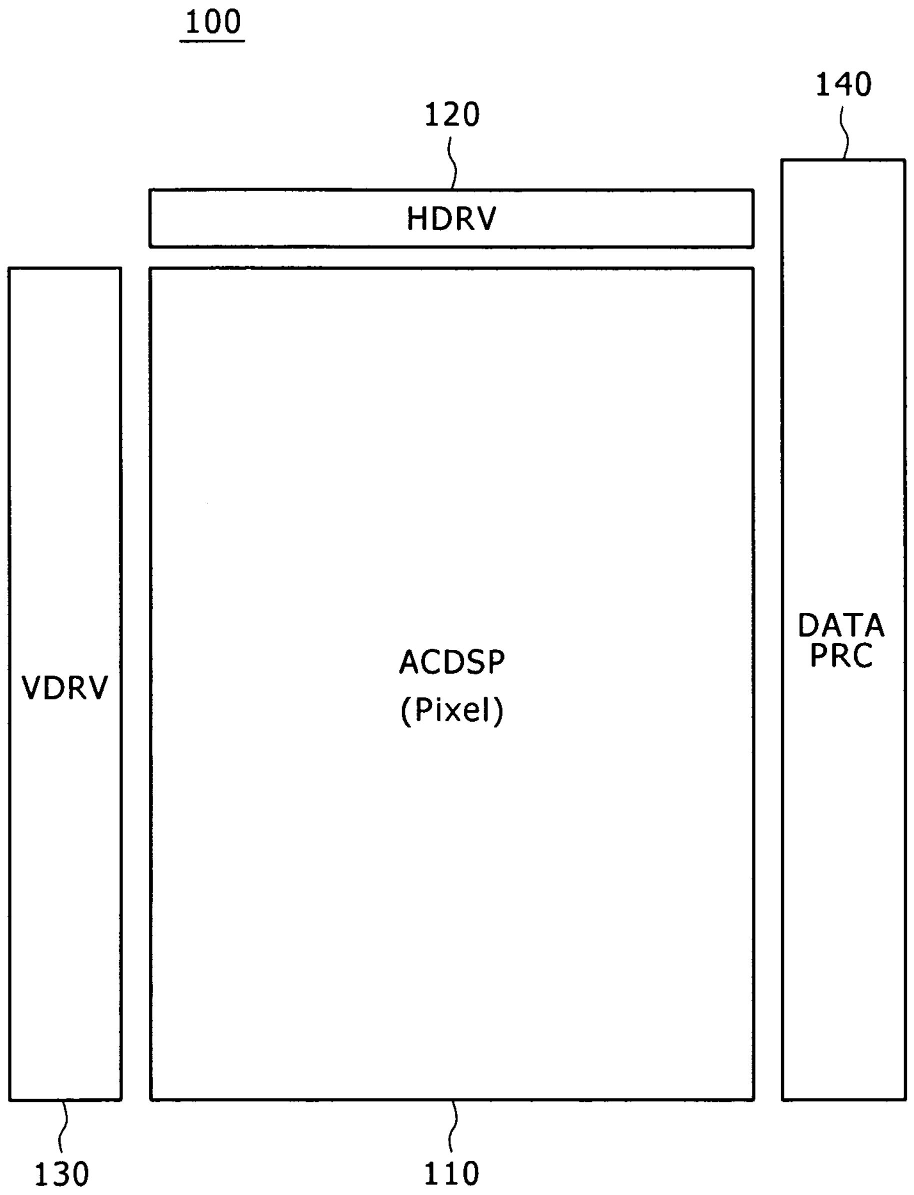
FIG. 6 is a diagram illustrating a configuration example of a display device according to an embodiment of the present invention.

FIG. 6 is a diagram illustrating a configuration example of a display device according to an embodiment of the present invention.

A description will be given here by taking, as an example, a case in which the present invention is applied to an active matrix liquid crystal display device using a liquid crystal cell as an electro-optical element of each of the pixels.

A liquid crystal display device 100 includes an effective display section (ACDSP) 110. The same section 110 includes a plurality of pixels, each having a liquid crystal cell, arranged in a matrix form on a transparent insulating substrate such as a glass substrate as illustrated in FIG. 6.

The liquid crystal display device 100 further includes a signal line drive circuit (horizontal drive circuit or source driver: HDRV) 120 adapted to drive signal lines.

The liquid crystal display device 100 still further includes a gate line drive circuit (vertical drive circuit or gate driver: VDRV) 130 and data processor (DATAPRC) 140. The gate line drive circuit 130 drives gate lines (scan lines) adapted to scan and select liquid crystal cells.

A description will be given below of the components, configuration and functions of the liquid crystal display device 100 in a step-by-step manner.

The effective display section (hereinafter simply referred to as the display section) 110 has a plurality of pixels, each having a liquid crystal cell, arranged in a matrix form.

Further, the same section 110 includes signal lines (data lines) and gate lines (vertical scan lines) disposed in a matrix form. The signal lines and gate lines are driven by the signal line drive circuit 120 and gate line drive circuit 130, respectively.

Figure 7:
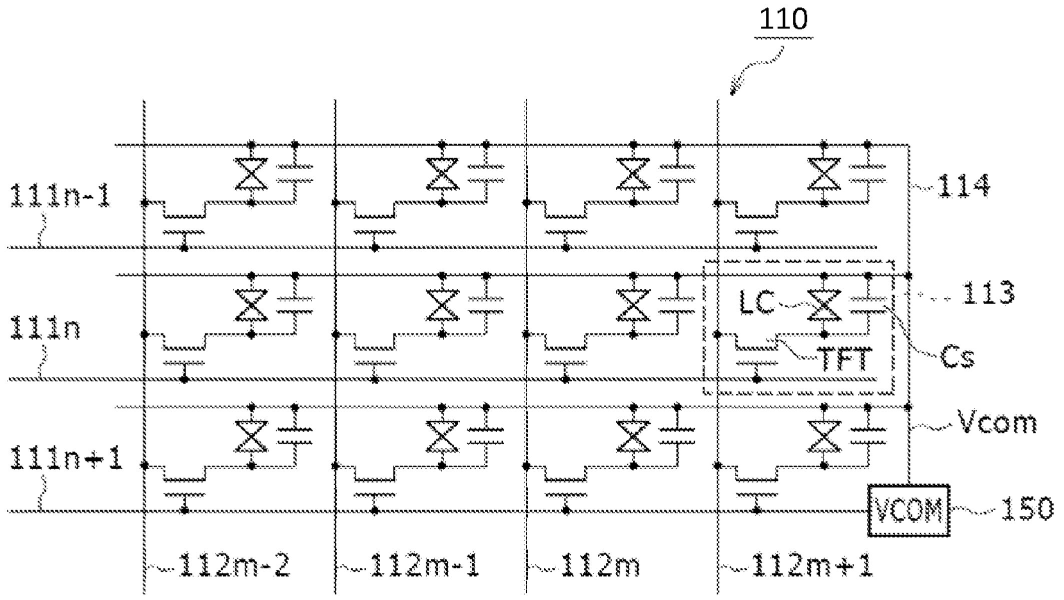
FIG. 7 is a circuit diagram illustrating a configuration example of an effective display section of a liquid crystal display device.

FIG. 7 is a circuit diagram illustrating a configuration example of the display section 110.

Here, three rows (n−1th to n+1th rows) and four columns (m−2th to m+1th rows) are shown as an example of a pixel arrangement for simplification of the drawing.

In FIG. 7, the display section 110 has gate lines (vertical scan lines) 111*n*−1, 111*n*, 111*n*+1 and so on and signal lines (data lines) 112*m*−2, 112*m*−1, 112*m*, 112*m*+1 and so on disposed in a matrix form. Further, unit pixels 113 are arranged each at one of the intersections between the gate lines and signal lines.

Each of the unit pixels 113 includes a pixel transistor or thin film transistor TFT, liquid crystal cell LC and holding capacitor Cs.

Here, the liquid crystal cell LC represents a capacitance that occurs between a pixel electrode (one of the electrodes) formed by the thin film transistor TFT and an opposed electrode (other electrode) formed to be opposed to the pixel electrode.

The thin film transistor TFT has its gate electrode connected to one of the gate lines (vertical scan lines) 111*n*−1, 111*n*, 111*n*+1 and so on, and its source electrode connected to one of the signal lines 112*m*−2, 112*m*−1, 112*m*, 112*m*+1 and so on.

The liquid crystal cell has its pixel electrode connected to the drain electrode of the thin film transistor TFT and its opposed electrode connected to a common line 114. The holding capacitor Cs is connected between the drain electrode of the thin film transistor TFT and the common line 114.

The common line 114 is supplied with a given AC voltage as a common voltage Vcom from a common voltage supply circuit (VCOM circuit) 150.

The gate lines 111*n*−1, 111*n*, 111*n*+1 and so on each have one of their ends connected to the output end of the associated row of the gate line drive circuit 130 shown in FIG. 6.

The gate line drive circuit 130 includes shift registers, and vertically scans the gate lines (vertical scan lines) 111*n*−1, 111*n*, 111*n*+1 and so on by generating a sequential vertical selection pulse and supplying the pulse to the gate lines in synchronism with a vertical transfer clock VCK (not shown).

Further, in the display section 110, the signal lines 112*m*−1, 112*m*+1 and so on each have one of their ends connected to the output end of the associated column of the signal line drive circuit 120 shown in FIG. 6.

The signal line drive circuit 120 is capable of converting digital drive data, changed to the level commensurate with the drive level and adapted to drive the signal lines, into analog data in response to a gray level voltage and amplifying the analog drive data to generate positive and negative signal voltages.

Further, the same circuit 120 is capable of selectively supplying positive and negative signal voltages to the signal lines adjacent to each other.

The data processor 140 includes level shifters adapted to change the level of parallel data, fed from external equipment, to a given level.

The same processor 140 also includes serial/parallel converters adapted to convert serial data, that has been changed in level, to parallel data and output the parallel data to the signal line drive circuit 120 in order to adjust the phase and reduce the frequency.

A specific description will be given below of the configurations and functions of the signal line drive circuit 120 according to the present embodiment.

<2. First Configuration Example of the Signal Line Drive Circuit>

Figure 8:
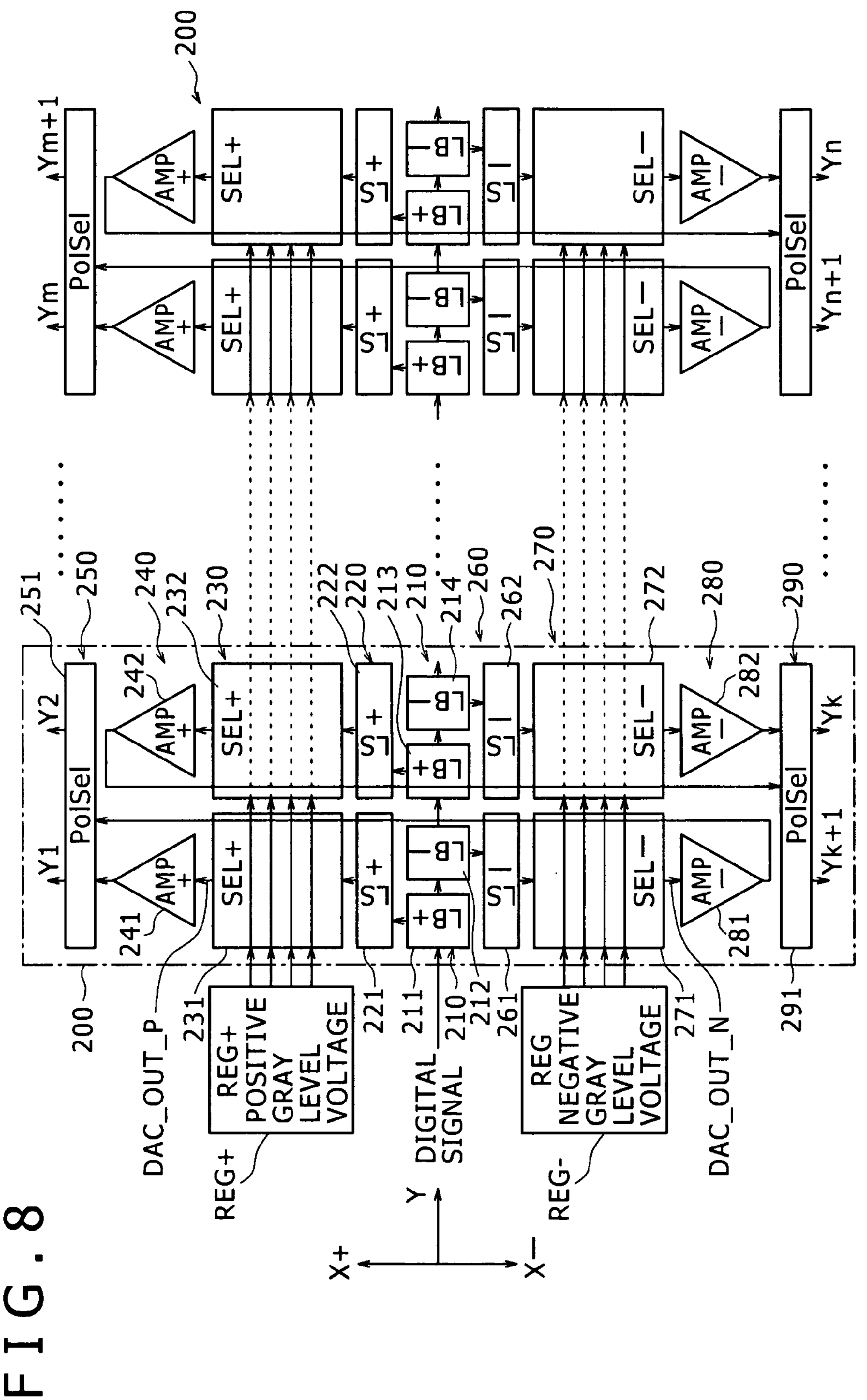
FIG. 8 is a block diagram illustrating a first configuration example including the component layout of a signal line drive circuit according to the present embodiment.

FIG. 8 is a block diagram illustrating a first configuration example including the component layout of the signal line drive circuit according to the present embodiment.

The signal line drive circuit 120 shown in FIG. 8 has a plurality of four-channel units 200 arranged in parallel in the Y direction of the XY coordinate system shown in the figure.

Each of the four-channel units 200 has a line buffer arrangement section 210 laid out in the center of the unit formation region along the X direction in FIG. 8.

A positive level shifter arrangement section 220 is laid out adjacent, in the positive X direction (on one side), to the line buffer arrangement section 210.

A positive selector arrangement section 230 is laid out further outward in the positive X direction from the positive level shifter arrangement section 220.

A positive buffer amplifier arrangement section 240 is laid out still further outward in the positive X direction from the positive selector arrangement section 230.

A first output selector arrangement section 250 adapted to switch between positive and negative voltages is laid out still further outward in the positive X direction from the positive buffer amplifier arrangement section 240.

On the other hand, a negative level shifter arrangement section 260 is laid out adjacent, in the negative X direction (on other side), to the line buffer arrangement section 210.

A negative selector arrangement section 270 is laid out further outward in the negative X direction from the negative level shifter arrangement section 260.

A negative buffer amplifier arrangement section 280 is laid out still further outward in the negative X direction from the negative selector arrangement section 270.

A second output selector arrangement section 290 adapted to switch between positive and negative voltages is laid out still further outward in the negative X direction from the negative buffer amplifier arrangement section 280.

A resistor string REG+ is arranged parallel to the selector arrangement section 230 as a positive voltage supply section.

A resistor string REG− is arranged parallel to the selector arrangement section 270 as a negative voltage supply section.

As described above, the signal line drive circuit 120 shown in FIG. 8 has line buffers LB+ and LB− arranged in the center, followed by positive level shifters LS+, positive selectors SEL+ and positive buffer amplifiers AMP+.

Further, the same circuit 120 has negative level shifters LS−, negative selectors SEL− and negative buffer amplifiers AMP− arranged to be symmetrical with the positive counterparts with respect to the line buffers LB.

A description will be given below of the more specific configuration of the four-channel unit 200 having the positive and negative components arranged symmetrically with respect to the line buffers LB+ and LB− and the advantageous effects of the component layouts of the four-channel unit and the chip as a whole in a step-by-step manner.

The line buffer arrangement section 210 has a positive line buffer (LB+) 211, negative line buffer (LB−) 212, positive line buffer 213 and negative line buffer 214 arranged in this order from left to right in the Y direction in FIG. 8.

Basically, the line buffers LB are supplied with digital drive data. This data is a gray level code for each channel converted from the data supplied from an unshown interface section.

The line buffers 211 to 214 sequentially shift and store the digital drive data, converted into gray level codes for the different channels.

The positive level shifter arrangement section 220 has two positive level shifters 221 and 222 arranged in this order from left to right in the Y direction in FIG. 8.

The positive level shifter 221 is arranged to approximately match the positions of the positive line buffer (LB+) 211 and negative line buffer (LB−) 212 in the Y direction.

The positive level shifter 222 is arranged to approximately match the positions of the positive line buffer (LB+) 213 and negative line buffer (LB−) 214 in the Y direction.

The positive level shifter 221 changes the level of the data from the positive line buffer 211 to a level commensurate with the drive level.

The input terminal of the positive level shifter 221 is arranged to be opposed to the output terminal of the positive line buffer 211, thus allowing for wiring over the shortest possible distance.

The positive level shifter 222 changes the level of the data from the positive line buffer 213 to a level commensurate with the drive level.

The input terminal of the positive level shifter 222 is arranged to be opposed to the output terminal of the positive line buffer 213, thus allowing for wiring over the shortest possible distance.

Figure 9:
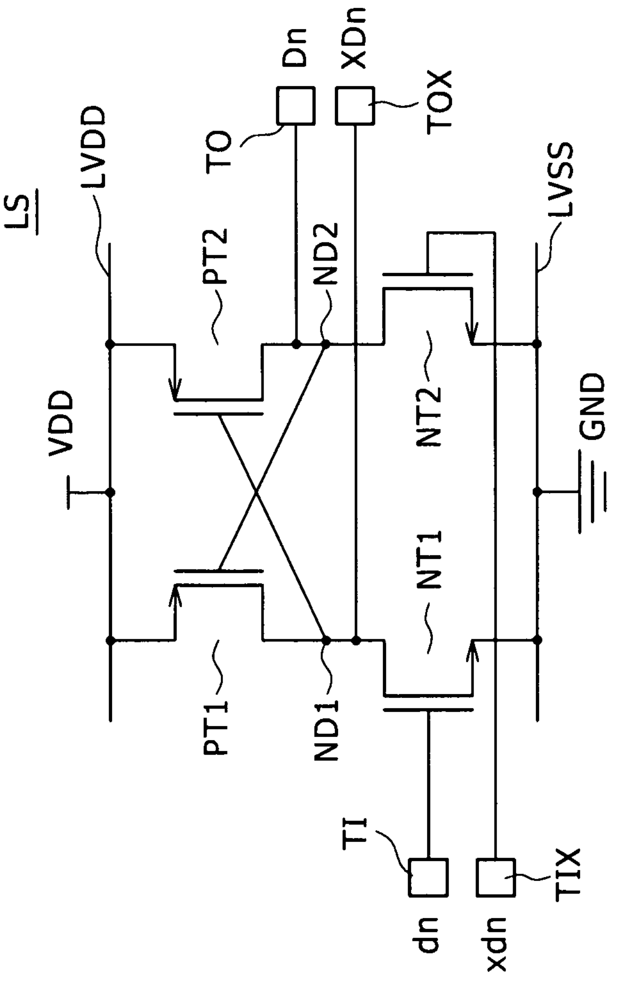
FIG. 9 is a circuit diagram illustrating a configuration example of a level shifter according to the present embodiment.

FIG. 9 is a circuit diagram illustrating a configuration example of the level shifter according to the present embodiment.

This level shifter LS includes PMOS transistors PT1 and PT2, NMOS transistors NT1 and NT2, nodes ND1 and ND2, input terminals TI and TIX, and output terminals TO and TOX.

The PMOS transistors PT1 and PT2 have their sources connected to a power line LVDD adapted to supply a source voltage VDD. The NMOS transistors NT1 and NT2 have their sources connected to a reference potential line LVSS. The same line LVSS is connected to a ground potential GND.

The PMOS transistor PT1 and NMOS transistor NT1 have their drains connected together. The connection point thereof forms the node ND1. The same node ND1 is connected to the gate of the PMOS transistor PT2 and the output terminal TOX.

The PMOS transistor PT2 and NMOS transistor NT2 have their drains connected together. The connection point thereof forms the node ND2. The same node ND2 is connected to the gate of the PMOS transistor PT1 and the output terminal TO.

Then, the NMOS transistor NT1 has its gate connected to the input terminal TI of a digital signal dn. The NMOS transistor NT2 has its gate connected to the input terminal TIX of a digital signal xdn (where 'x' represents inversion).

When the low-voltage data signals dn and xdn are supplied, dn at high level and xdn at low level, from the line buffer LB, the NMOS transistor NT1 turns on, and the NMOS transistor NT2 turns off.

As a result, the node ND1 drops in potential to the ground level, turning on the PMOS transistor PT2 and causing the node ND2 to rise in potential to the source voltage VDD level. This maintains the PMOS transistor PT1 in an off condition and the node ND1 stably at the ground potential.

As a result, high-voltage signals Dn and XDn are output, Dn at high level and XDn at low level, respectively from the output terminals TO and TOX.

When the low-voltage data signals dn and xdn are supplied, dn at low level and xdn at high level, from the line buffer LB, the NMOS transistor NT1 turns off, and the NMOS transistor NT2 turns on.

As a result, the node ND2 drops in potential to the ground level, turning on the PMOS transistor PT1 and causing the node ND1 to rise in potential to the source voltage VDD level. This maintains the PMOS transistor PT2 in an off condition and the node ND2 stably at the ground potential.

As a result, the high-voltage signals Dn and XDn are output, Dn at low level and XDn at high level, respectively from the output terminals TO and TOX.

The positive selector arrangement section 230 has two positive selectors 231 and 232 arranged in this order from left to right in the Y direction in FIG. 8.

The positive selector 231 is arranged to approximately match the position of the positive level shifter 221 in the Y direction.

The positive selector 232 is arranged to approximately match the position of the positive level shifter 222 in the Y direction.

The positive selector 231 selects one of positive gray level voltages Vp1 to Vpm, generated by the positive register string REG+, according to the output data from the positive level shifter 221 and outputs the selected voltage level.

The input terminal of the positive selector 231 is arranged to be opposed to the output terminal of the positive level shifter 221, thus allowing for wiring over the shortest possible distance.

The positive selector 232 selects one of the positive gray level voltages Vp1 to Vpm, generated by the positive register string REG+, according to the output data from the positive level shifter 222 and outputs the selected voltage level.

The input terminal of the positive selector 232 is arranged to be opposed to the output terminal of the positive level shifter 222, thus allowing for wiring over the shortest possible distance.

The positive selectors 231 and 232 are capable of serving as digital/analog converters (DACs) adapted to convert digital drive data into analog data in response to a gray level voltage.

Figure 10:
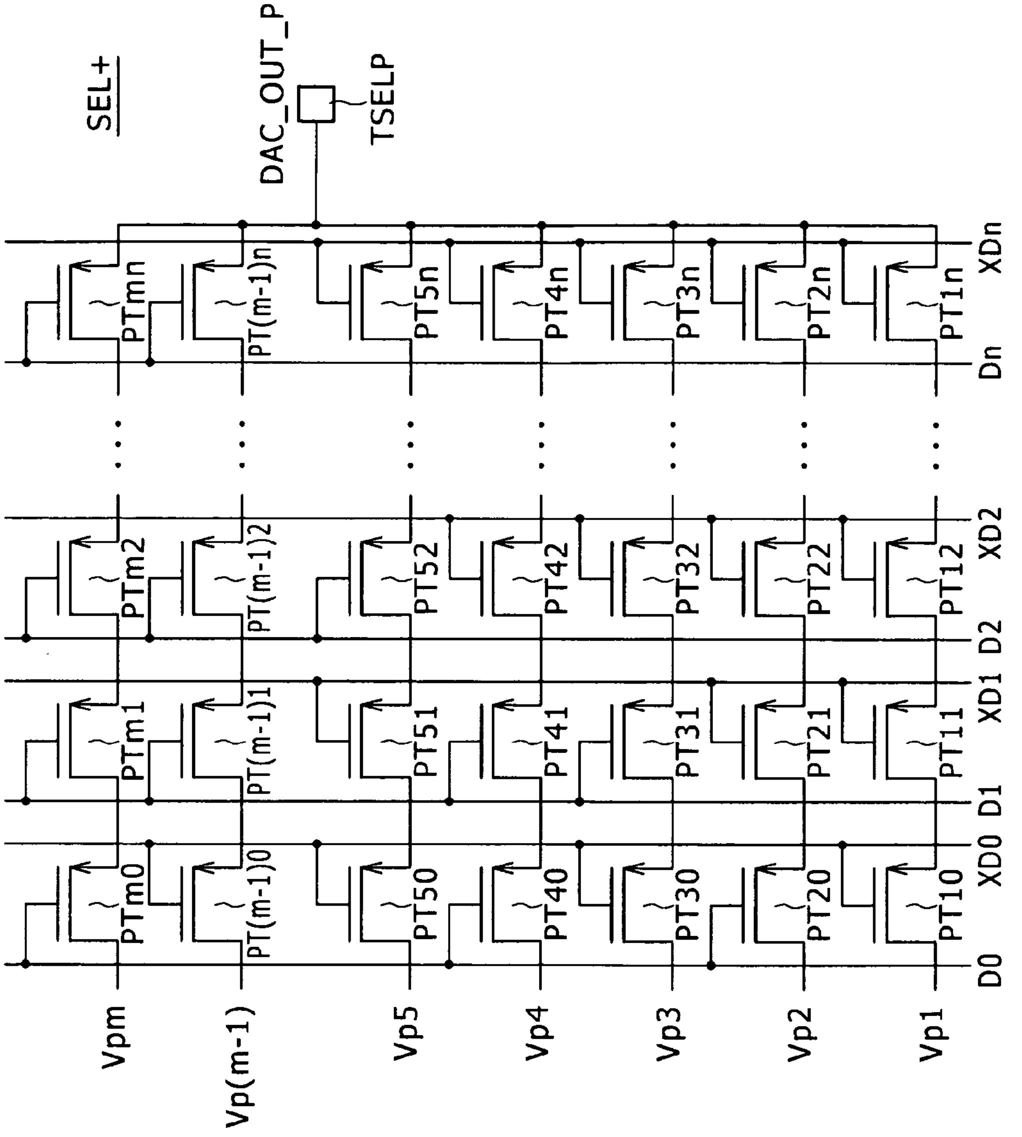
FIG. 10 is a circuit diagram illustrating a configuration example of a positive selector according to the present embodiment.

FIG. 10 is a circuit diagram illustrating a configuration example of the positive selector according to the present embodiment.

The positive selector SEL+ (231 or 232) shown in FIG. 10 is a series-gated selector formed solely by a plurality of PMOS transistors arranged in a matrix of m rows by (n+1) columns.

The positive selector SEL+ has PMOS transistors PT10 to PT1*n*, PT20 to PT2*n*, PT30 to PT3*n*, PT40 to PT4*n*, PT50 to PT5*n*, and so on through PT(m−1)0 to PT(m−1)n and PTm0 to PTmn arranged in a matrix form.

In the positive selector SEL+, the PMOS transistors PT10 to PT1*n* are connected in series, the PMOS transistors PT20 to PT2*n* connected in series, and the PMOS transistors PT30 to PT3*n* connected in series.

In the positive selector SEL+, the PMOS transistors PT40 to PT4*n* are connected in series, and the PMOS transistors PT50 to PT5*n* connected in series.

In the positive selector SEL+, the PMOS transistors PT(m−1)0 to PT(m−1)n are connected in series, and the PMOS transistors PTm0 to PTmn connected in series.

The positive gray level voltage Vp1 is fed to the drain of the PMOS transistor PT11 in the first row, and the positive gray level voltage Vp2 to the drain of the PMOS transistor PT21 in the second row.

The positive gray level voltage Vp3 is fed to the drain of the PMOS transistor PT31 in the third row, the positive gray level voltage Vp4 to the drain of the PMOS transistor PT41 in the fourth row, and the positive gray level voltage Vp5 to the drain of the PMOS transistor PT51 in the fifth row.

The positive gray level voltage Vp(m−1) is fed to the drain of the PMOS transistor PT(m−1)-1 in the (m−1)th row, and the positive gray level voltage Vpm to the drain of the PMOS transistor PTm1 in the mth row.

The sources of the PMOS transistors PT1*n* to PTmn in the nth row are all connected to an output terminal TSELP of the positive selector SEL+.

The gates of the PMOS transistors PT10 to PTm0 in the zeroth column are selectively connected to one of differential signals D0 and XD0 supplied from the level shifter LS+.

The gates of the PMOS transistors PT11 to PTm1 in the first column are selectively connected to one of differential signals D1 and XD1 supplied from the level shifter LS+.

The gates of the PMOS transistors PT12 to PTm2 in the second column are selectively connected to one of differential signals D2 and XD2 supplied from the level shifter LS+.

The gates of the PMOS transistors PT1*n* to PTmn in the nth column are selectively connected to one of differential signals Dn and XDn supplied from the level shifter LS+.

The positive selector SEL+ (231 or 232) configured as described above selects and outputs one of the positive gray level voltages Vp1 to Vpm generated by the positive resistor string REG+ according to the output data from the positive level shifter LS+.

Data DAC_OUT_P output from the positive selector SEL+ (231 or 232) is converted from a digital to an analog signal and output.

The positive buffer amplifier arrangement section 240 has two positive buffer amplifiers 241 and 242 arranged in this order from left to right in the Y direction in FIG. 8.

The positive buffer amplifier 241 is arranged to approximately match the position of the positive selector 231 in the Y direction.

The positive buffer amplifier 242 is arranged to approximately match the position of the positive selector 232 in the Y direction.

The positive buffer amplifier 241 amplifies the drive data output from the positive selector 231.

The input terminal of the positive buffer amplifier 241 is arranged to be opposed to the output terminal of the positive selector 231, thus allowing for wiring over the shortest possible distance.

The positive buffer amplifier 242 amplifies the drive data output from the positive selector 232.

The input terminal of the positive buffer amplifier 242 is arranged to be opposed to the output terminal of the positive selector 232, thus allowing for wiring over the shortest possible distance.

The positive output selector arrangement section 250 has a positive output selector 251 arranged therein.

The positive output selector 251 selects and outputs two pieces of drive data, one output from the positive buffer amplifier 241 and another from a negative buffer amplifier 281.

The same selector 251 selectively supplies a pair of signal lines, disposed adjacent to each other in a liquid crystal panel 160, with positive and negative signal voltages.

The channel count n is, in reality, in the several hundreds or more, and the signal lines associated with these channels are driven.

The level shifter arrangement section 260 has two negative level shifters 261 and 262 arranged in this order from left to right in the Y direction in FIG. 8.

The negative level shifter 261 is arranged to approximately match the positions of the positive line buffer (LB+) 211 and negative line buffer (LB−) 212 in the Y direction.

The negative level shifter 262 is arranged to approximately match the positions of the positive line buffer (LB+) 213 and negative line buffer (LB−) 214 in the Y direction.

The negative level shifter 261 changes the level of the data from the negative line buffer 212 to a level commensurate with the drive level.

The input terminal of the negative level shifter 261 is arranged to be opposed to the output terminal of the negative line buffer 212, thus allowing for wiring over the shortest possible distance.

The negative level shifter 262 changes the level of the data from the negative line buffer 214 to a level commensurate with the drive level.

The input terminal of the negative level shifter 262 is arranged to be opposed to the output terminal of the negative line buffer 214, thus allowing for wiring over the shortest possible distance.

The negative level shifters 261 and 262 may be configured in the same manner as the level shifter shown in FIG. 9.

The negative selector arrangement section 270 has two negative selectors 271 and 272 arranged in this order from left to right in the Y direction in FIG. 8.

The negative selector 271 is arranged to approximately match the position of the negative level shifter 261 in the Y direction.

The negative selector 272 is arranged to approximately match the position of the negative level shifter 262 in the Y direction.

The negative selector 271 selects one of negative gray level voltages Vn1 to Vnm, generated by the negative register string REG−, according to the output data from the negative level shifter 261 and outputs the selected voltage level.

The input terminal of the negative selector 271 is arranged to be opposed to the output terminal of the negative level shifter 261, thus allowing for wiring over the shortest possible distance.

The negative selector 272 selects one of the negative gray level voltages Vn1 to Vnm, generated by the negative register string REG−, according to the output data from the negative level shifter 262 and outputs the selected voltage level.

The input terminal of the negative selector 272 is arranged to be opposed to the output terminal of the negative level shifter 262, thus allowing for wiring over the shortest possible distance.

The negative selectors 271 and 272 are capable of serving as digital/analog converters (DACs) adapted to convert digital drive data into analog data in response to a gray level voltage.

Figure 11:
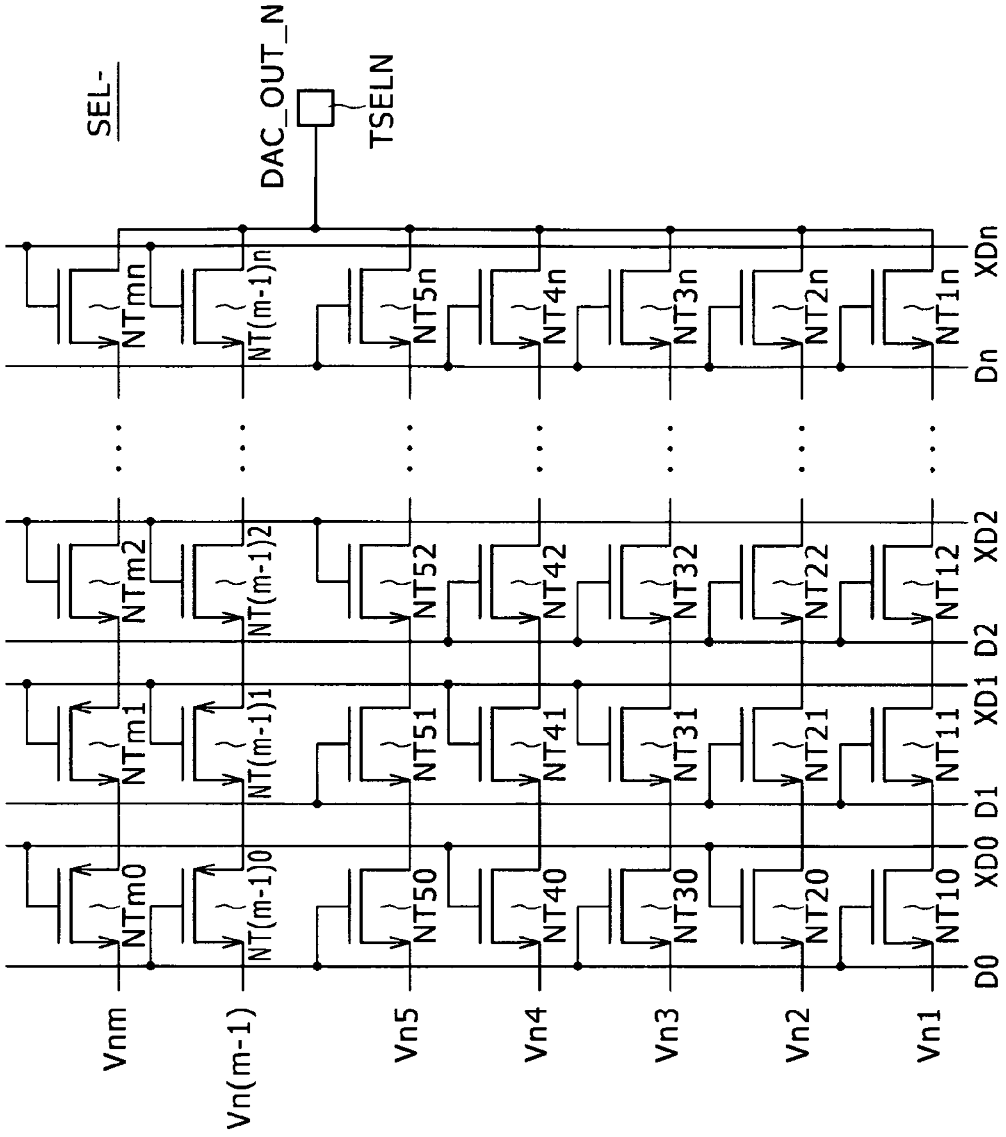
FIG. 11 is a circuit diagram illustrating a configuration example of a negative selector according to the present embodiment.

FIG. 11 is a circuit diagram illustrating a configuration example of the negative selector according to the present embodiment.

The negative selector SEL− (271 or 272) shown in FIG. 11 is a series-gated selector formed solely by a plurality of NMOS transistors arranged in a matrix of m rows by (n+1) columns.

The negative selector SEL− has NMOS transistors NT10 to NT1*n*, NT20 to NT2*n*, NT30 to NT3*n*, NT40 to NT4*n*, NT50 to NT5*n*, and so on through NT(m−1)0 to NT(m−1)n and NTm0 to NTmn arranged in a matrix form.

In the negative selector SEL−, the NMOS transistors NT10 to NT1*n* are connected in series, the NMOS transistors NT20 to NT2*n* connected in series, and the NMOS transistors NT30 to NT3*n* connected in series.

In the negative selector SEL−, the NMOS transistors NT40 to NT4*n* are connected in series, and the NMOS transistors NT50 to NT5*n* connected in series.

In the negative selector SEL−, the NMOS transistors NT(m−1)0 to NT(m−1)n are connected in series, and the NMOS transistors NTm0 to NTmn connected in series.

The negative gray level voltage Vn1 is fed to the drain of the NMOS transistor NT11 in the first row, and the negative gray level voltage Vn2 to the drain of the NMOS transistor NT21 in the second row.

The negative gray level voltage Vn3 is fed to the drain of the NMOS transistor NT31 in the third row, the negative gray level voltage Vn4 to the drain of the NMOS transistor NT41 in the fourth row, and the negative gray level voltage Vn5 to the drain of the NMOS transistor NT51 in the fifth row.

The negative gray level voltage Vn(m−1) is fed to the drain of the NMOS transistor NT(m−1) in the (m−1)th row, and the negative gray level voltage Vnm to the drain of the NMOS transistor NTm1 in the mth row.

The sources of the NMOS transistors NT1*n* to NTmn in the nth row are all connected to an output terminal TSELN of the negative selector SEL−.

The gates of the NMOS transistors NT10 to NTm0 in the zeroth column are selectively connected to one of the differential signals D0 and XD0 supplied from the level shifter LS−.

The gates of the NMOS transistors NT11 to NTm1 in the first column are selectively connected to one of the differential signals D1 and XD1 supplied from the level shifter LS−.

The gates of the NMOS transistors NT12 to NTm2 in the second column are selectively connected to one of the differential signals D2 and XD2 supplied from the level shifter LS−.

The gates of the NMOS transistors NT1*n* to NTmn in the nth column are selectively connected to one of the differential signals Dn and XDn supplied from the level shifter LS−.

The negative selector SEL− (271 or 272) configured as described above selects and outputs one of the negative gray level voltages Vn1 to Vnm generated by the negative resistor string REG− according to the output data from the negative level shifter LS−.

Data DAC_OUT_N from the negative selector SEL− (271 or 272) is converted from a digital to an analog signal and output.

The negative buffer amplifier arrangement section 280 has two negative buffer amplifiers 281 and 282 arranged in this order from left to right in the Y direction in FIG. 8.

The negative buffer amplifier 281 is arranged to approximately match the position of the negative selector 271 in the Y direction.

The negative buffer amplifier 282 is arranged to approximately match the position of the negative selector 272 in the Y direction.

The negative buffer amplifier 281 amplifies the drive data output from the negative selector 271.

The input terminal of the negative buffer amplifier 281 is arranged to be opposed to the output terminal of the negative selector 271, thus allowing for wiring over the shortest possible distance.

The negative buffer amplifier 282 amplifies the drive data output from the negative selector 272.

The input terminal of the negative buffer amplifier 282 is arranged to be opposed to the output terminal of the negative selector 272, thus allowing for wiring over the shortest possible distance.

The negative output selector arrangement section 290 has a negative output selector 291 arranged therein.

The negative output selector 291 selects and outputs two pieces of drive data, one output from the negative buffer amplifier 282 and another from the negative buffer amplifier 242.

The same selector 291 selectively supplies a pair of signal lines, disposed adjacent to each other in the liquid crystal panel 160, with positive and negative signal voltages.

In the four-channel unit 200 configured as described above, a wire is routed from the negative buffer amplifier 281 to the positive output selector 251 as follows.

That is, a wire is routed along the side of the negative buffer amplifier 281, the top of the negative selector 271, the top of the negative level shifter 261, the side of the negative line buffer 212, the top of the positive level shifter 221, the top of the positive selector 231 and the side of the positive buffer amplifier 241.

A wire is routed from the positive buffer amplifier 242 to the negative output selector 291 as follows.

That is, a wire is routed along the side of the positive buffer amplifier 242, the top of the positive selector 242, the top of the positive level shifter 222, the top of the positive line buffer 213, the top of the negative level shifter 262, the top of the negative selector 272 and the side of the negative buffer amplifier 282.

A description will be given here of a specific configuration example of a pair of the positive and negative buffer amplifiers AMP+ and AMP− and output selector PolSel.

Figure 12:
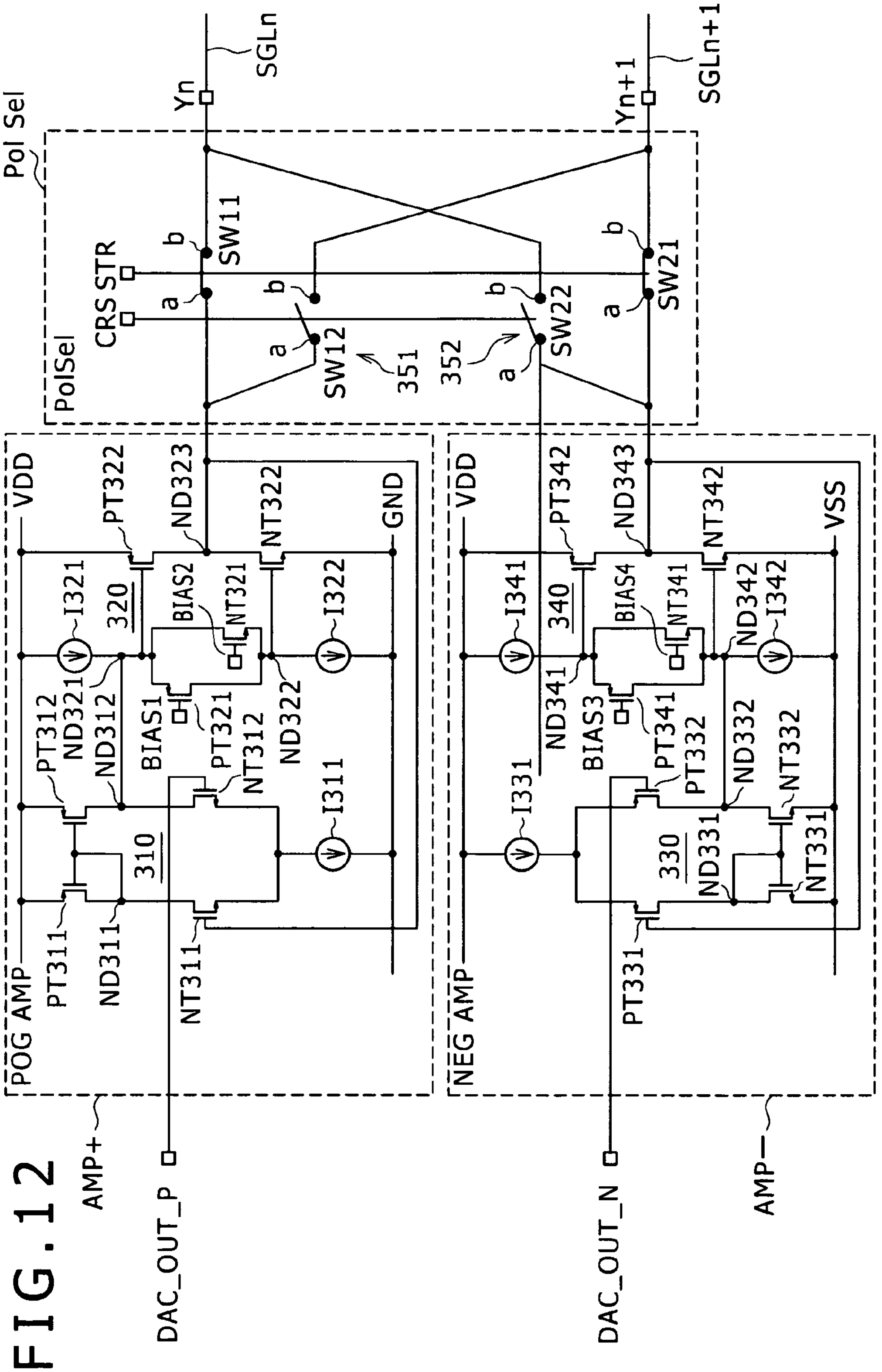
FIG. 12 is a circuit diagram specifically illustrating a configuration example of positive and negative buffer amplifiers and output selector according to the present embodiment.

FIG. 12 is a circuit diagram illustrating a specific configuration example of the positive and negative buffer amplifiers and output selector according to the present embodiment.

The positive buffer amplifier AMP+ includes a differential amplifier section 310 and output buffer section 320 that are cascaded as illustrated in FIG. 12.

The differential amplifier section 310 includes PMOS transistors PT311 and PT312, NMOS transistors NT311 and NT312, current source I311 and nodes ND311 and ND312.

The PMOS transistors PT311 and PT312 have their sources connected to the supply source of the source voltage VDD.

The PMOS transistor PT311 has its drain connected to the drain of the NMOS transistor NT311. The connection point thereof forms the node ND311. Further, the PMOS transistor PT311 has its drain and gate connected together. The connection point thereof is connected to the gate of the PMOS transistor PT312.

The PMOS transistor PT312 has its drain connected to the drain of the NMOS transistor NT312. The connection point thereof forms the output node ND312 of the differential amplifier section 310.

The NMOS transistors NT311 and NT312 have their sources connected together. The connection point thereof is connected to the current source I311.

The gate of the NMOS transistor NT311 forms the inverted input terminal (−) of the positive buffer amplifier AMP+, and the gate of the NMOS transistor NT312 the non-inverted input terminal (+) thereof.

Therefore, the signal DAC_OUT_P output from the positive selector SEL+ (DAC) is fed to the gate of the NMOS transistor NT312. The NMOS transistor NT311 has its gate connected to the output terminal of the output buffer section 320.

The differential amplifier section 310 configured as described above differentially amplifies the output signal of the positive selector SEL+ at the previous stage and that of the output buffer section 320 using a differential amplifier (differential pair) made up of the NMOS transistors NT311 and NT312.

The differential amplifier section 310 outputs differentially amplified data signal to the output buffer section 320.

The output buffer section 320 includes PMOS transistors PT321 and PT322, NMOS transistors NT321 and NT322, current sources I321 and I322 and nodes ND321, ND322 and ND323.

The source of the PMOS transistor PT321 and the drain of the NMOS transistor NT321 are connected to the current source I321 that is connected to the source potential. The connection point thereof forms the output node ND321. This node ND321 is connected to the output node ND312 of the differential amplifier section 310.

The drain of the PMOS transistor PT321 and the source of the NMOS transistor NT321 are connected to the current source I322 that is connected to the reference potential. The connection point thereof forms the output node ND322.

The PMOS transistor PT321 has its gate connected to the supply line of a bias signal BIAS1. The NMOS transistor NT321 has its gate connected to the supply line of a bias signal BIAS2.

The PMOS transistor PT322 has its source connected to the source voltage VDD and its drain connected to the drain of the NMOS transistor NT322. The connection point thereof forms the output node ND323 of the output buffer section 320. The NMOS transistor NT322 has its source connected to a reference potential VSS which is, in this case, the ground GND.

The PMOS transistor PT322 has its gate connected to the node ND321. The NMOS transistor NT322 has its gate connected to the node ND322. The output node ND323 is connected to the gate of the NMOS transistor NT311 of the differential amplifier section 310.

Further, the node ND323 is connected to the first input terminal of the output selector PolSel.

The output buffer section 320 receives the data signal amplified by the differential amplifier section 310 and outputs a positive signal, adapted to drive the signal line associated with the signal, to the output selector PolSel.

The negative buffer amplifier AMP− includes a differential amplifier section 330 and output buffer section 340 that are cascaded as illustrated in FIG. 12.

The differential amplifier section 330 includes PMOS transistors PT331 and PT332, NMOS transistors NT331 and NT332, current source I331 and nodes ND331 and ND332.

The NMOS transistors NT331 and NT332 have their sources connected to the reference potential VSS which is, in this case, the ground GND.

The NMOS transistor NT331 has its drain connected to the drain of the PMOS transistor PT331. The connection point thereof forms the node ND331. Further, the NMOS transistor 331 has its drain and gate connected together. The connection point thereof is connected to the gate of the NMOS transistor NT332.

The NMOS transistor NT332 has its drain connected to the drain of the PMOS transistor PT332. The connection point thereof forms the output node ND332 of the differential amplifier section 330.

The PMOS transistors PT331 and PT332 have their sources connected together. The connection point thereof is connected to the current source I331.

The gate of the PMOS transistor PT331 forms the inverted input terminal (−) of the negative buffer amplifier AMP−, and the gate of the PMOS transistor PT332 the non-inverted input terminal (+) thereof.

Therefore, the signal DAC_OUT_N output from the negative selector SEL− (DAC) is fed to the gate of the PMOS transistor PT332. The PMOS transistor PT331 has its gate connected to the output terminal of the output buffer section 340.

The differential amplifier section 330 configured as described above differentially amplifies the output signal of the negative selector SEL− (DAC) at the previous stage and the output of the output buffer section 340 using a differential amplifier (differential pair) made up of the PMOS transistors PT331 and PT332.

The differential amplifier section 330 outputs differentially amplified data signal to the output buffer section 340.

The output buffer section 340 includes PMOS transistors PT341 and PT342, NMOS transistors NT341 and NT342, current sources I341 and I342 and nodes ND341, ND342 and ND343.

The source of the PMOS transistor PT341 and the drain of the NMOS transistor NT341 are connected to the current source I341 that is connected to the source potential. The connection point thereof forms the node ND341.

The drain of the PMOS transistor PT341 and the source of the NMOS transistor NT341 are connected to the current source I342 that is connected to the reference potential. The connection point thereof forms the output node ND342. This node ND342 is connected to the output node ND332 of the differential amplifier section 330.

The PMOS transistor PT341 has its gate connected to the supply line of a bias signal BIAS3. The NMOS transistor NT341 has its gate connected to the supply line of a bias signal BIAS4.

The PMOS transistor PT342 has its source connected to the source voltage VDD and its drain connected to the drain of the NMOS transistor NT342. The connection point thereof forms the output node ND343 of the output buffer section 340. The NMOS transistor NT342 has its source connected to the reference potential VSS which is, in this case, the ground GND.

The PMOS transistor PT342 has its gate connected to the node ND341. The NMOS transistor NT342 has its gate connected to the node ND342. The output node ND343 is connected to the gate of the NMOS transistor NT331 of the differential amplifier section 330.

Further, the node ND343 is connected to the second input terminal of the output selector PolSel.

The output buffer section 340 receives the data signal amplified by the differential amplifier section 330 and outputs a negative signal, adapted to drive the signal line associated with the signal, to the output selector PolSel.

The output selector PolSel includes first and second switch groups 351 and 352.

The first switch group 351 includes switches SW11 and SW12. The switch SW11 is controlled to turn on or off by a signal STR. The switch SW12 is controlled to turn on or off by a signal CRS. The switches SW11 and SW12 are complementarily turned on and off.

The switch SW11 has its terminal ‘a’ connected to the output of the output buffer section 320 of the positive buffer amplifier AMP+ and its terminal ‘b’ connected to a signal line SGLn of a channel Yn.

The switch SW12 has its terminal ‘a’ connected to the output of the output buffer section 320 of the positive buffer amplifier AMP+ and its terminal ‘b’ connected to a signal line SGLn+1 of a channel Yn+1. (Switches SW21 and SW22 shown in FIG. 12 are shown the wrong way around.)

The second switch group 352 includes switches SW21 and SW22. The switch SW21 is controlled to turn on or off by the signal STR. The switch SW22 is controlled to turn on or off by the signal CRS. The switches SW21 and SW22 are complementarily turned on and off.

The switch SW21 has its terminal ‘a’ connected to the output of the output buffer section 340 of the negative buffer amplifier AMP− and its terminal ‘b’ connected to the signal line SGLn+1 of the channel Yn+1.

The switch SW22 has its terminal ‘a’ connected to the output of the output buffer section 340 of the negative buffer amplifier AMP− and its terminal ‘b’ connected to the signal line SGLn of the channel Yn. (Switches SW21 and SW22 shown in FIG. 12 are shown the wrong way around.)

In the output selector PolSel configured as described above, the switches SW11 and SW21 are controlled to turn on, and the switches SW12 and SW22 controlled to turn off.

This allows for the positive buffer amplifier AMP+ to supply a positive signal voltage to the signal line SGLn and the negative buffer amplifier AMP− to supply a negative signal voltage to the signal line SGLn+1.

On the other hand, the switches SW12 and SW22 are controlled to turn on, and the switches SW11 and SW21 controlled to turn off.

This allows for the positive buffer amplifier AMP+ to supply a positive signal voltage to the signal line SGLn+1 and the negative buffer amplifier AMP− to supply a negative signal voltage to the signal line SGLn.

As described above, the components are arranged as follows in the present first embodiment to form the four-channel unit 200 of the signal line drive circuit.

That is, the line buffers 211 to 214 are arranged in the center. The level shifters 221 and 222, adapted to change the positive digital signal from a high to low voltage level, are arranged above the line buffers 211 to 214. The positive selectors 231 and 232, adapted to be controlled by the outputs of the positive level shifters 221 and 222, are arranged on the outside of the level shifters 221 and 222.

Further, the positive buffer amplifiers 241 and 242, adapted to receive the outputs of the positive selectors 231 and 232, are arranged on the outside of the same selectors 231 and 232.

On the opposite side, the level shifters 261 and 262, adapted to change the negative digital signal from a low to high voltage level, are arranged to be symmetrical with the positive level shifters 221 and 222 with respect to the line buffers 211 to 214.

The negative selectors 271 and 272, adapted to be controlled by the outputs of the negative level shifters 261 and 262, are arranged on the outside of the level shifters 261 and 262. The negative buffer amplifiers 281 and 282, adapted to receive the outputs of the negative selectors 271 and 272, are arranged on the outside of the same selectors 271 and 272.

Still further, the output selector 251 is arranged at the outermost position of the positive arrangement region. The output selector 251 selects the outputs from the positive and negative buffer amplifiers and switches between positive and negative signal voltages for the two channels on the left in FIG. 8.

The output selector 291 is arranged at the outermost position of the negative arrangement region. The output selector 291 selects the outputs from the positive and negative buffer amplifiers and switches between positive and negative signal voltages for the two channels on the right in FIG. 8.

Naturally, the blocks are normally laid out to have the same area using ordinary techniques. Therefore, because the positive and negative level shifters LS+ and LS−, positive and negative selectors SEL+ and SEL− and positive and negative output selectors 251 and 291 can be expanded two-fold in the Y direction, the same components must be reduced to half the size in the X direction.

A description will be given here of the operation of the four-channel unit 200 according to the present embodiment.

A positive digital signal for the positive side in the positive X direction in FIG. 8 is fed to the positive level shifter 221 from the line buffer 211 in which positive digital data is latched, changing the digital signal from a low to high voltage level.

The output of the level shifter 221 is fed to the positive selector 231, allowing a voltage level to be selected from among the plurality of voltages Vp1 to Vpm, obtained by division with the resistors of the resistor string, and output.

A negative digital signal for the negative side in the negative X direction in FIG. 8 is fed to the negative level shifter 261 from the line buffer 212 in which negative digital data is latched, changing the digital signal from a low to high voltage level.

The output of the level shifter 261 is fed to the positive selector 271, allowing a voltage level to be selected from among the plurality of voltages Vn1 to Vnm, obtained by division with the resistors of the resistor string, and output.

If the digital-to-analog conversion of the high-order bits is conducted separately from that of the low-order bits, the low-order bits are processed between the selector output to the operational amplifier or by using an operational amplifier capable of interpolating the low-order bits.

The voltage output from the positive selector 231 is buffered by the positive buffer amplifier (operational amplifier) 241. Similarly, the voltage output from the positive selector 271 is buffered by the negative buffer amplifier (operational amplifier) 281.

The output of the positive buffer amplifier 241 for the two channels on the left is directly fed to the output selector 251.

On the other hand, the output of the negative buffer amplifier 281 passes by the negative selector 271, negative level shifter 261, line buffer 212, positive level shifter 221, positive selector 231 and positive buffer amplifier 241 before being fed to the output selector 251.

The output selector 251 switches between positive and negative signals for output in the positive X direction (i.e., upward direction).

The output of the positive buffer amplifier 242 for the two channels on the right passes by the positive selector 232, positive level shifter 222, line buffer 213, the side portion of negative level shifter 262, negative selector 272 and negative buffer amplifier 280 before being fed to the output selector 291.

The output selector 291 switches between positive and negative signals for output in the negative X direction (i.e., downward direction).

Figure 13:
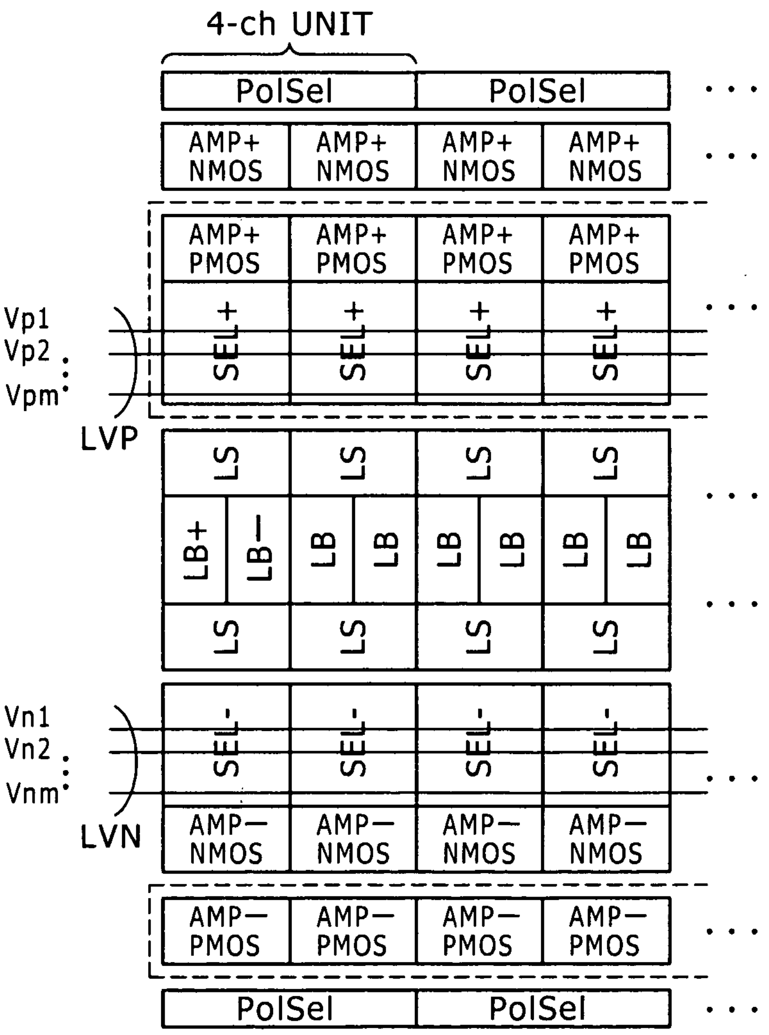
FIG. 13 is a diagram illustrating the component layout shown in the block diagram of FIG. 8.

FIG. 13 is a diagram illustrating the component layout shown in the block diagram of FIG. 8.

When we focus our attention on the arrangement of the positive and negative selectors in FIG. 13, only the positive selectors SEL+ are provided on the upper side with the line buffers LB in the center.

Similarly, only the negative selectors SEL− can be provided on the lower side.

This provides a layout free from the well isolation portion SPC as produced by existing techniques.

Further, output voltage wires LVP and LVN from the register strings do not pass above the selectors of opposite polarity.

Although the selectors in the example shown in FIG. 8 are series-gated, the present invention is not limited thereto. Even if the selectors are not series-gated, the same advantageous effects can be achieved so long as the positive selectors SEL+ include PMOS transistors, and the negative selectors SEL− NMOS transistors.

Figure 14:
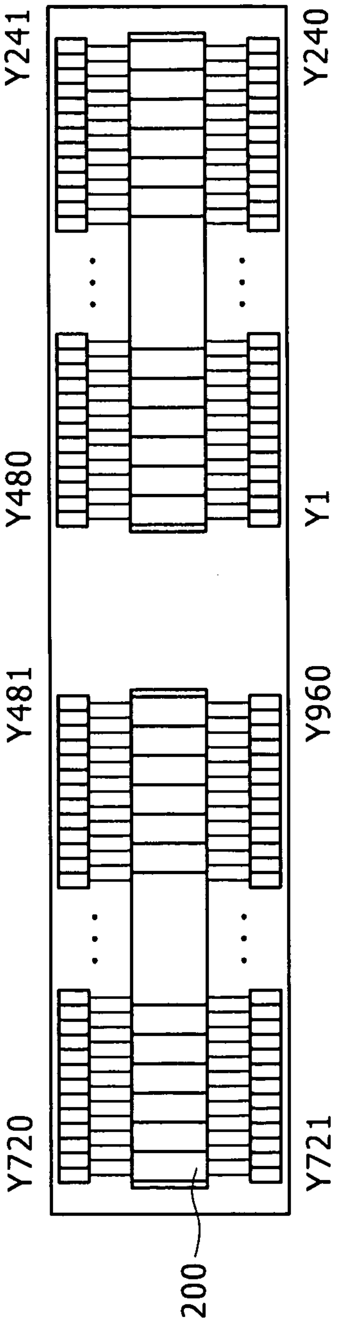
FIG. 14 is a conceptual diagram illustrating a driver chip formed by arranging a plurality of four-channel T units each of whose components are laid out as illustrated in FIG. 13.

FIG. 14 is a conceptual diagram illustrating a driver chip formed by arranging the plurality of four-channel T units 200 each of whose components are laid out as illustrated in FIG. 13.

Figure 1:
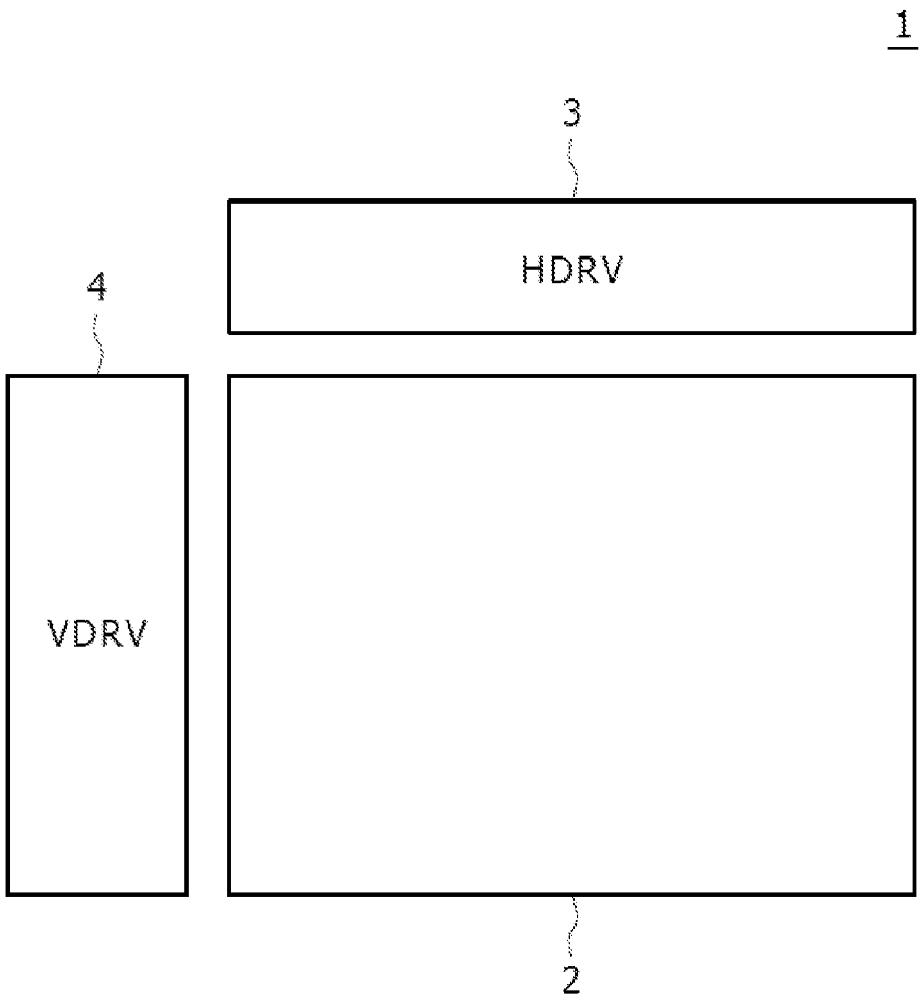
FIG. 1 is a diagram illustrating a rough configuration of a common liquid crystal display device.
Figure 2:
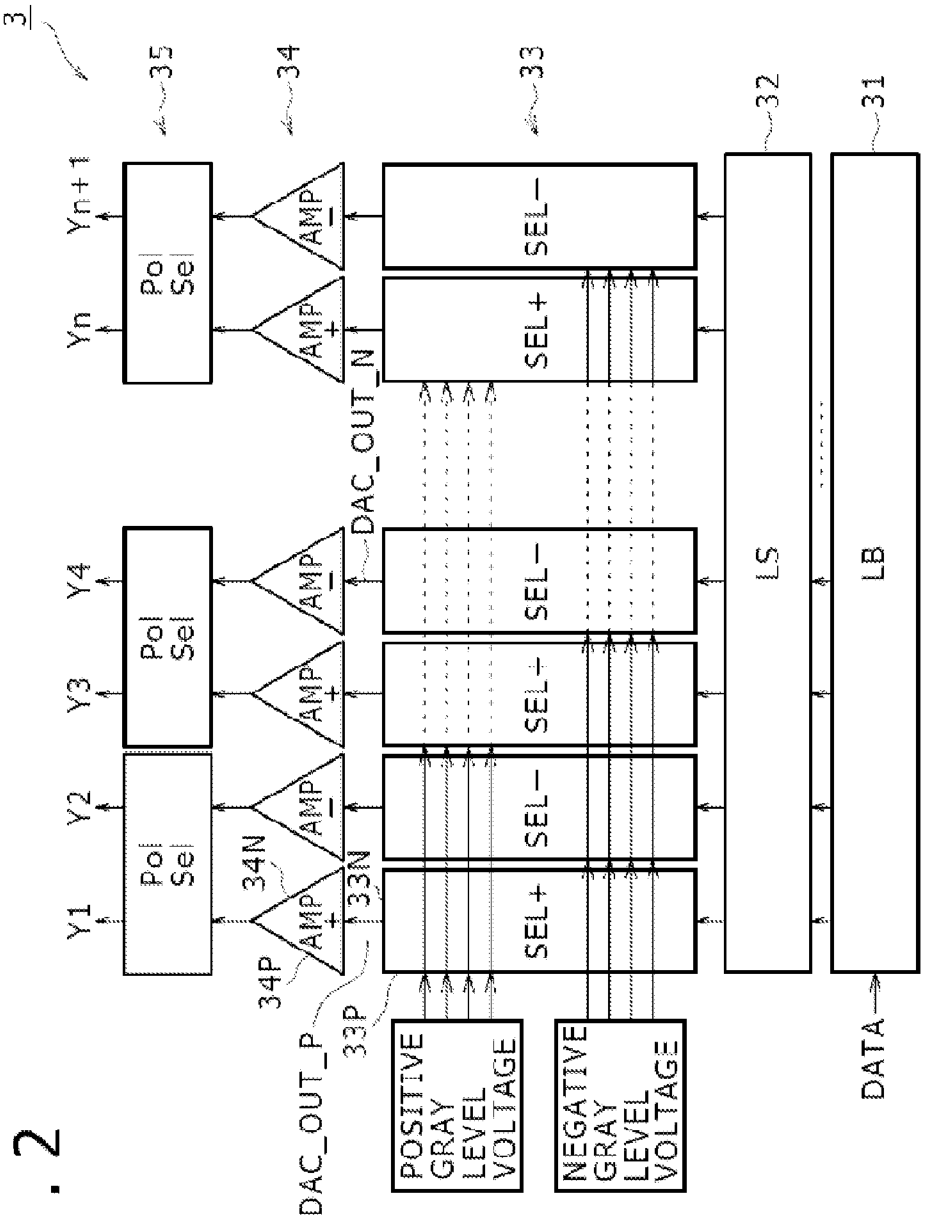
FIG. 2 is a block diagram illustrating a configuration example of a common signal line drive circuit using output selectors.
Figure 3:
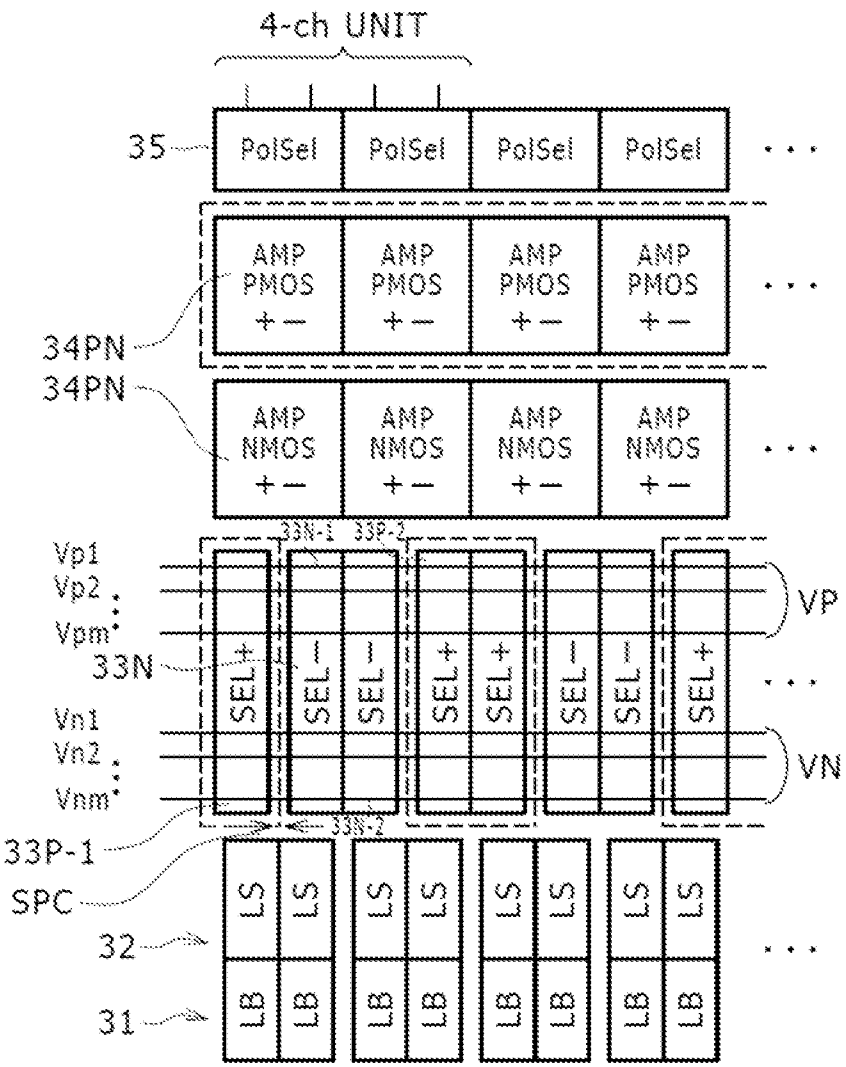
FIG. 3 is a diagram illustrating the component layout of a common four-channel signal line drive circuit unit.
Figure 4:
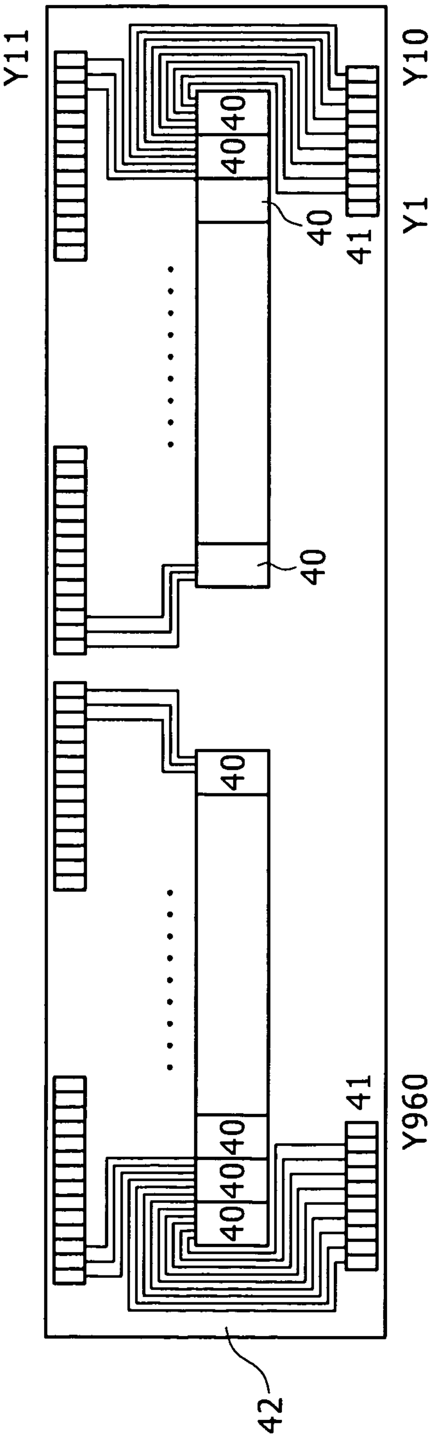
FIG. 4 is a diagram illustrating a layout example in which the unit shown in FIG. 3 is arranged repeatedly in a single stage configuration.
Figure 5:
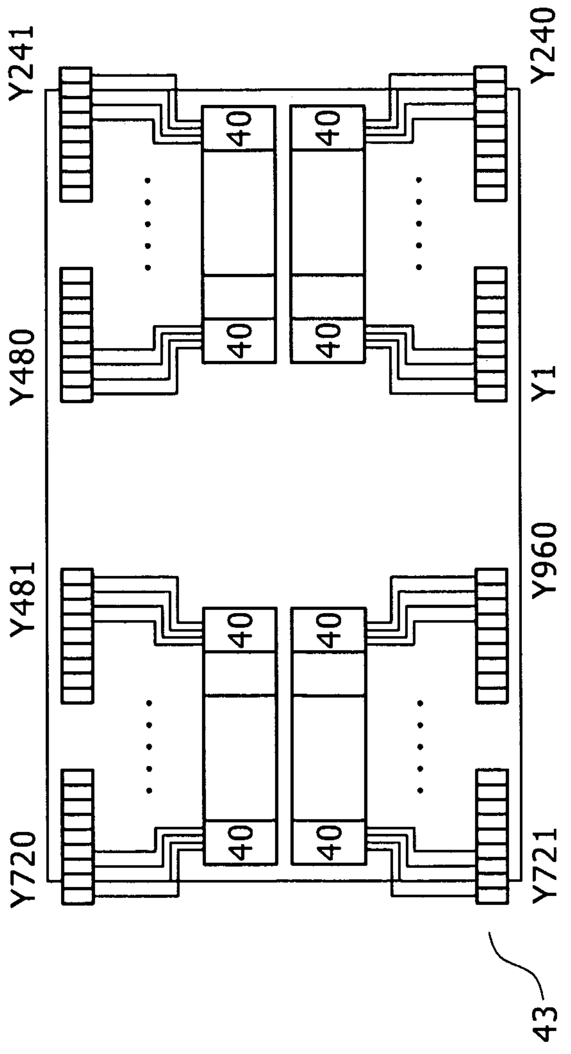
FIG. 5 is a diagram illustrating a layout example in which the unit shown in FIG. 3 is arranged repeatedly in a two-stage configuration.

As illustrated in FIG. 14, in the present embodiment, the chip can produce outputs from the top and bottom sides despite having the same height as the single-stage chip made up of the existing four-channel units shown in FIG. 4.

<3. Second Configuration Example of the Signal Line Drive Circuit>

Figure 15:
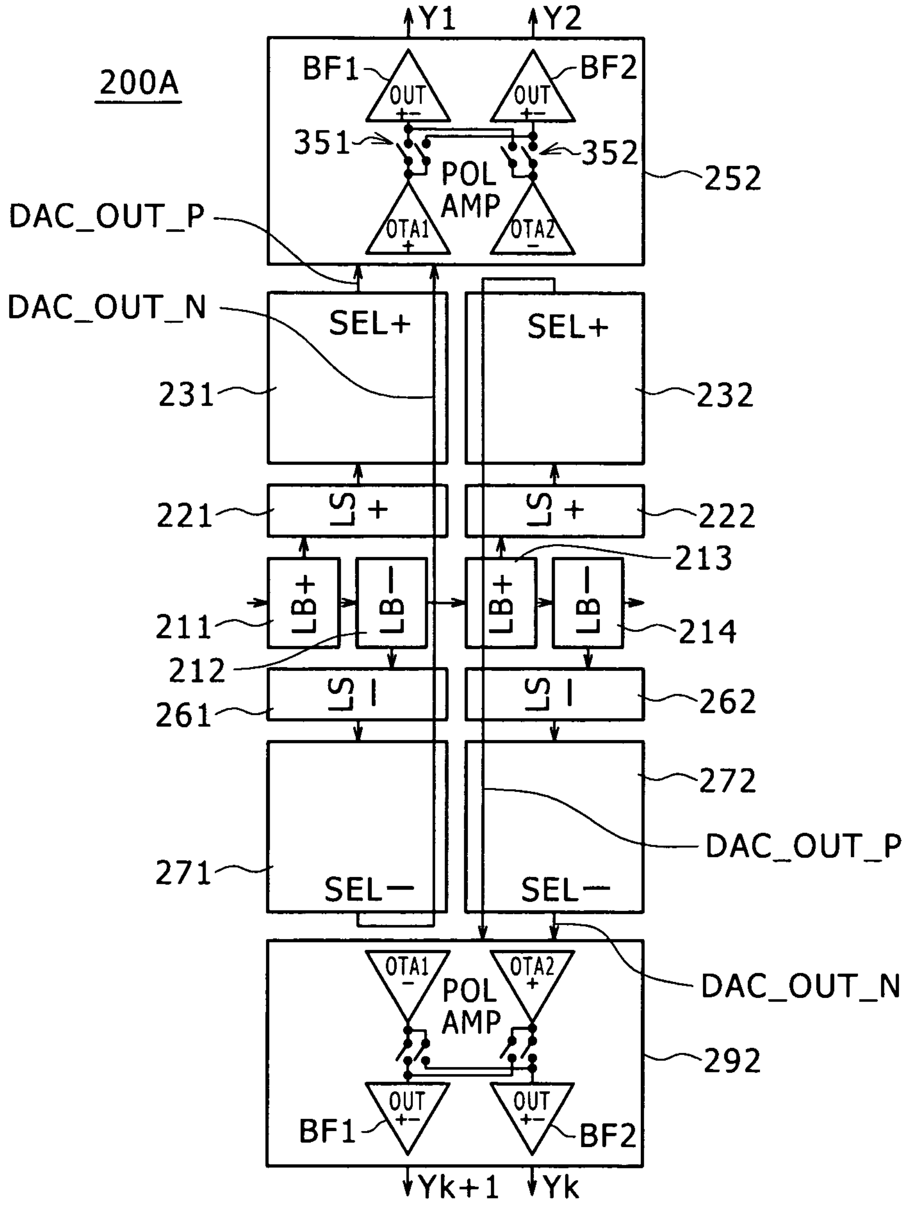
FIG. 15 is a block diagram illustrating a second configuration example including the component layout of the signal line drive circuit according to the present embodiment.

FIG. 15 is a block diagram illustrating a second configuration example including the component layout of the signal line drive circuit according to the present embodiment.

A four-channel unit 200A of the signal line drive circuit shown in FIG. 15 has a buffer section 252 arranged on the output side of the positive selectors SEL+ of the configuration shown in FIG. 8. The same section 252 incorporates positive/negative switching capability.

A buffer section 292 is arranged on the output side of the negative selectors SEL− in such a manner as to be symmetrical with the buffer section 252 with respect to the arrangement region of the line buffers LB. The same section 292 incorporates positive/negative switching capability.

Both of the buffer sections 252 and 292 have the switch groups 351 and 352 of the output selector shown in FIG. 12 arranged between the outputs of differential amplifier sections OTA1 and OTA2 and the inputs of output buffers BF1 and BF2.

<4. Third Configuration Example of the Signal Line Drive Circuit>

Figure 16:
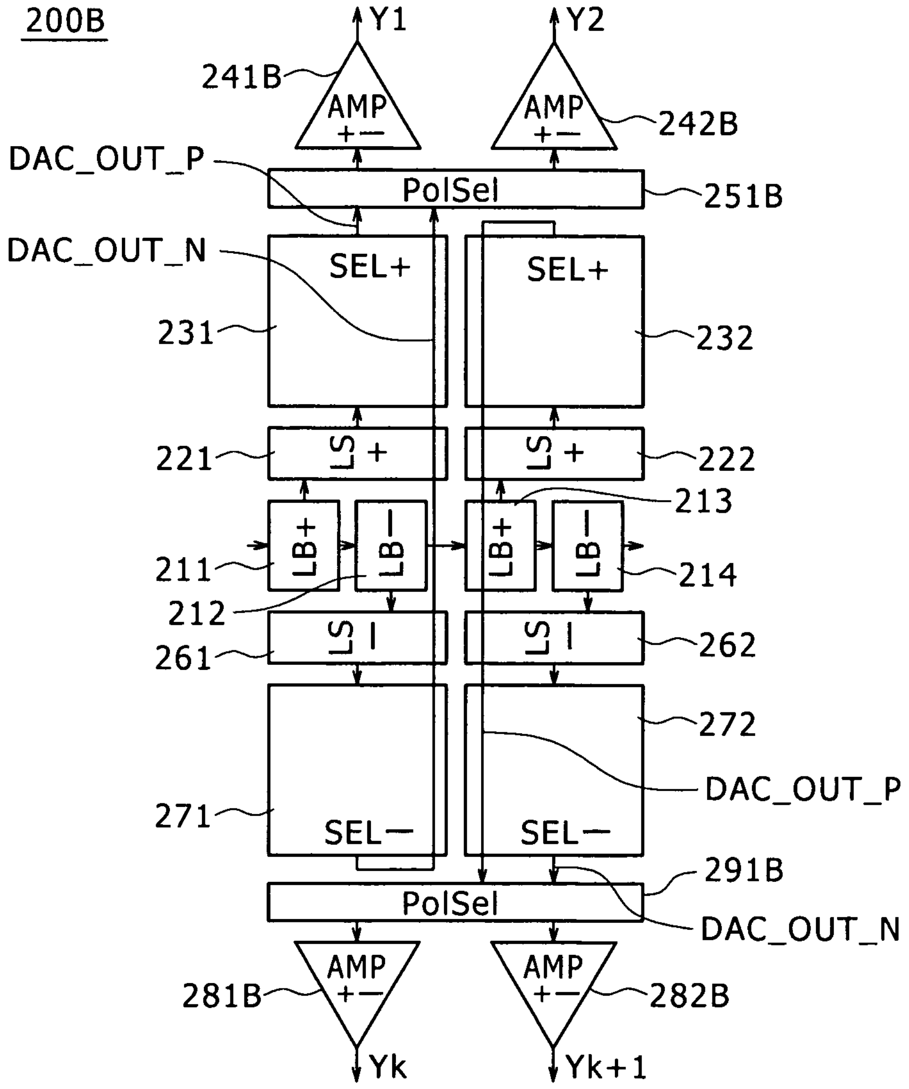
FIG. 16 is a block diagram illustrating a third configuration example including the component layout of the signal line drive circuit according to the present embodiment.

FIG. 16 is a block diagram illustrating a third configuration example including the component layout of the signal line drive circuit according to the present embodiment.

A four-channel unit 200B of the signal line drive circuit shown in FIG. 16 has a positive/negative switching selector 251B arranged on the output side of the positive selectors SEL+, and buffer amplifiers 241B and 242B arranged on the output side of the positive/negative switching selector 251B. The buffer amplifiers 241B and 242B are capable of outputting positive and negative voltages.

A positive/negative switching selector 291B is arranged on the output side of the negative selectors SEL− in such a manner as to be symmetrical with the positive/negative switching selector 251B with respect to the arrangement region of the line buffers LB, and buffer amplifiers 281B and 282B are arranged on the output side of the positive/negative switching selector 291B. The buffer amplifiers 281B and 282B are capable of outputting positive and negative voltages.

The four-channel unit 200A shown in FIG. 15 includes output switching amplifiers.

The four-channel unit 200B shown in FIG. 16 includes amplifiers each of which receives and outputs both positive and negative voltages.

The two four-channel units are common in that the selectors of the same polarity can be advantageously arranged side by side. The outputs of these selectors are connected one to the component provided upward and another to the component provided downward from these selectors.

A description will be given below of the above-described advantageous effects of the present embodiment with reference to FIG. 13 and other figures illustrating more specific configuration diagrams and comparative examples.

Figure 17:
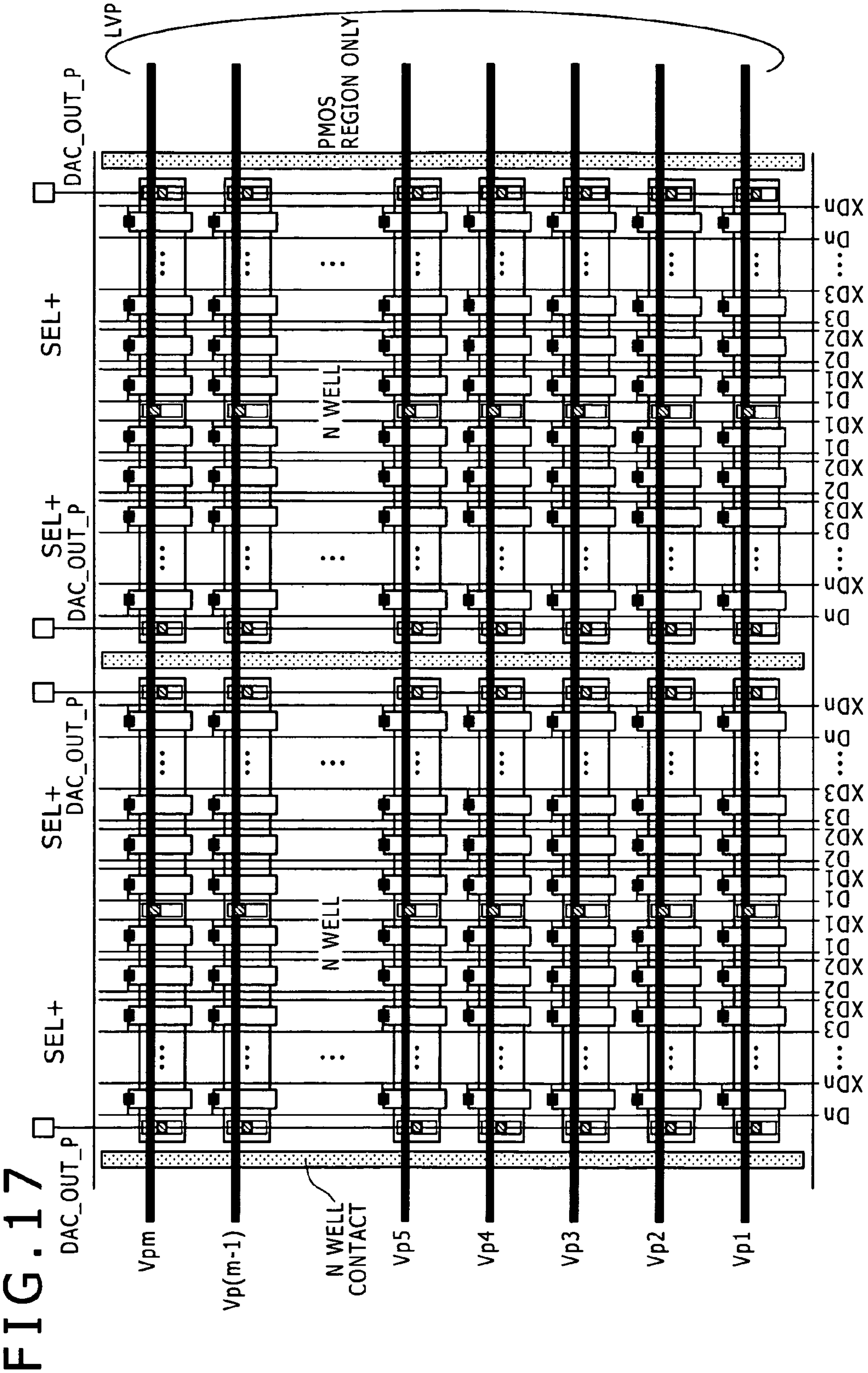
FIG. 17 is a diagram specifically illustrating the layout and configuration of positive selectors according to the present embodiment.

FIG. 17 is a diagram specifically illustrating the layout and configuration of the positive selectors according to the present embodiment.

Figure 18:
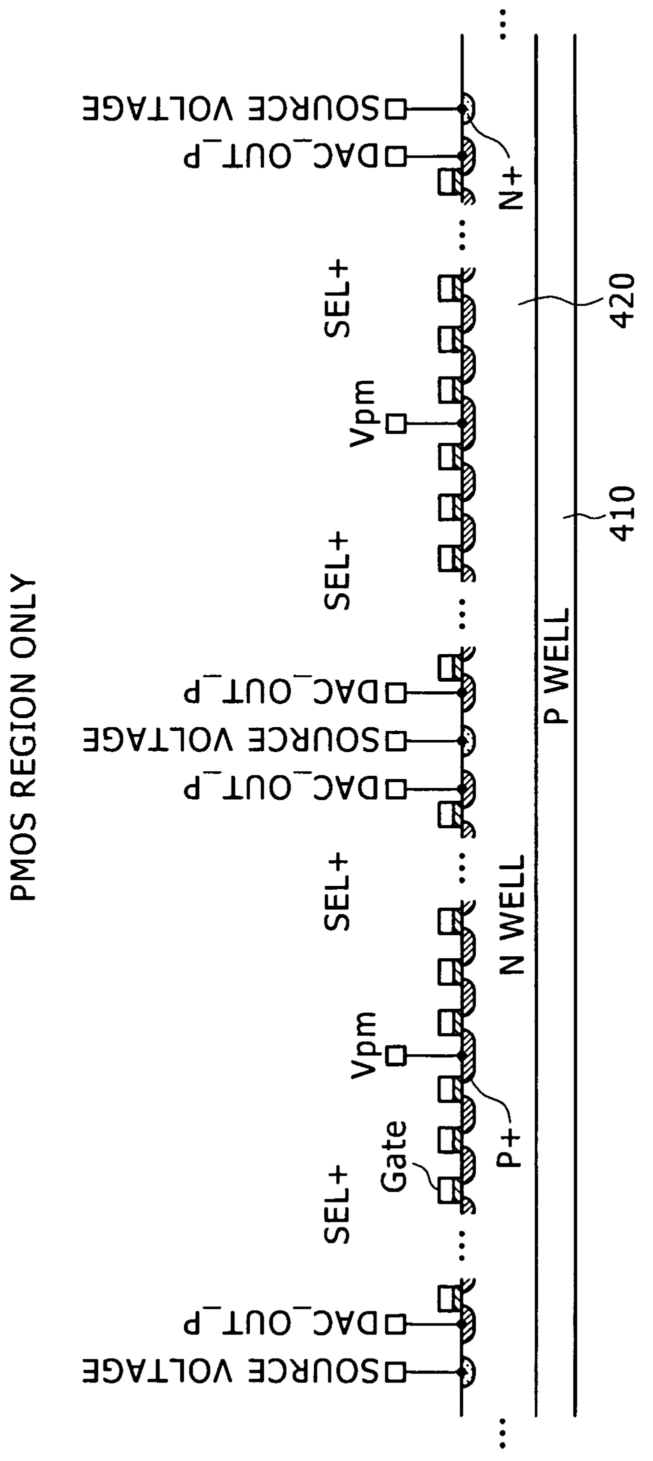
FIG. 18 is a diagram illustrating a simplified vertical cross-sectional structure of the positive selectors according to the present embodiment.

FIG. 18 is a diagram illustrating a simplified vertical cross-sectional structure of the positive selectors according to the present embodiment.

Figure 19:
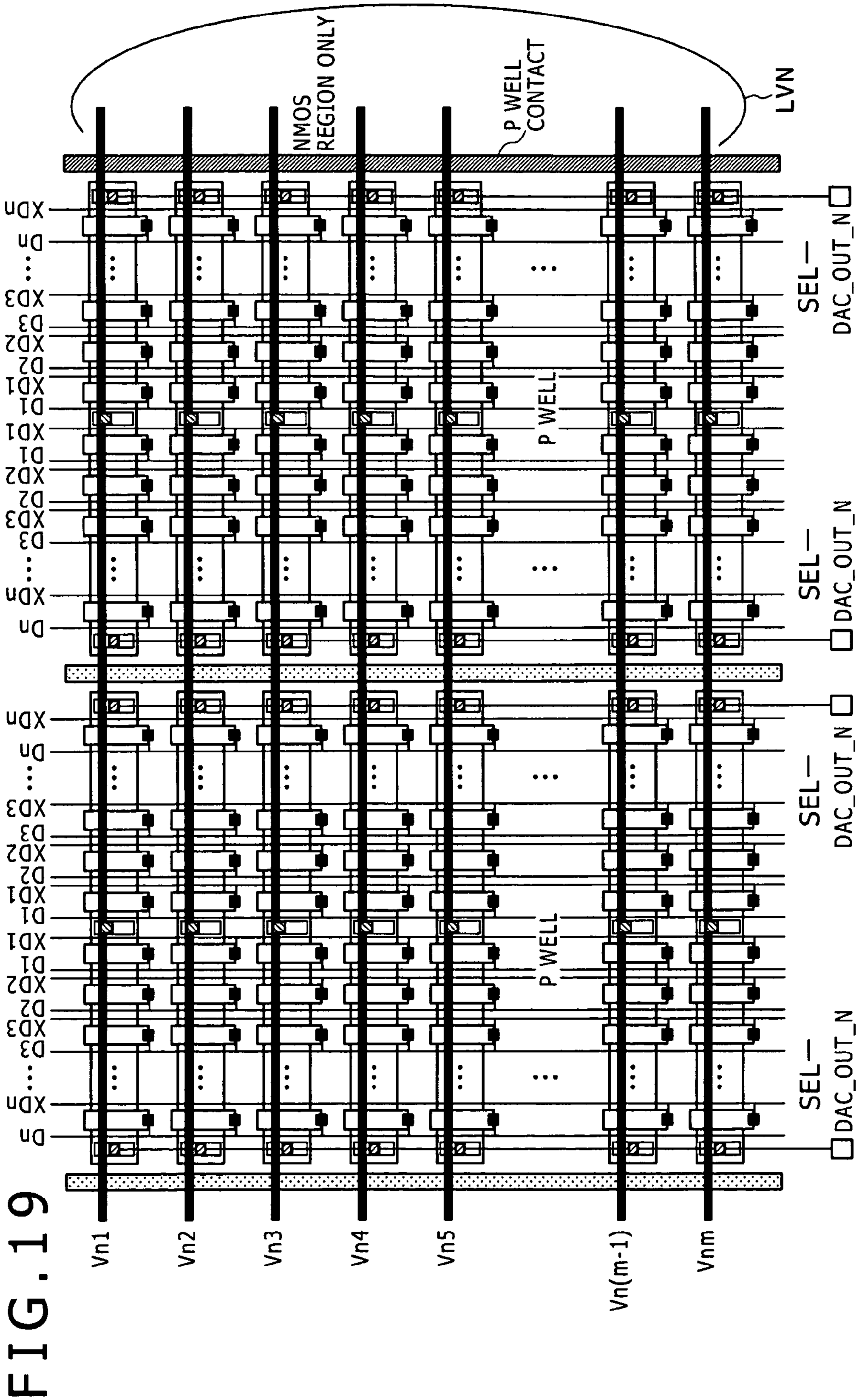
FIG. 19 is a diagram specifically illustrating the layout and configuration of negative selectors according to the present embodiment.

FIG. 19 is a diagram specifically illustrating the layout and configuration of the negative selectors according to the present embodiment.

Figure 20:
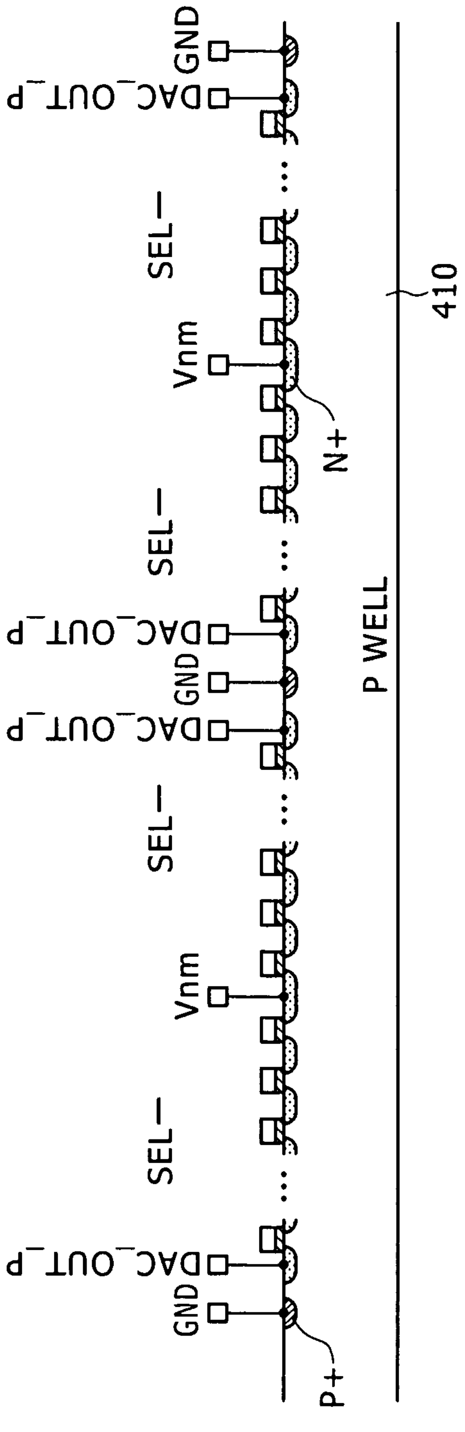
FIG. 20 is a diagram illustrating a simplified vertical cross-sectional structure of the negative selectors according to the present embodiment.

FIG. 20 is a diagram illustrating a simplified vertical cross-sectional structure of the negative selectors according to the present embodiment.

Figure 21:
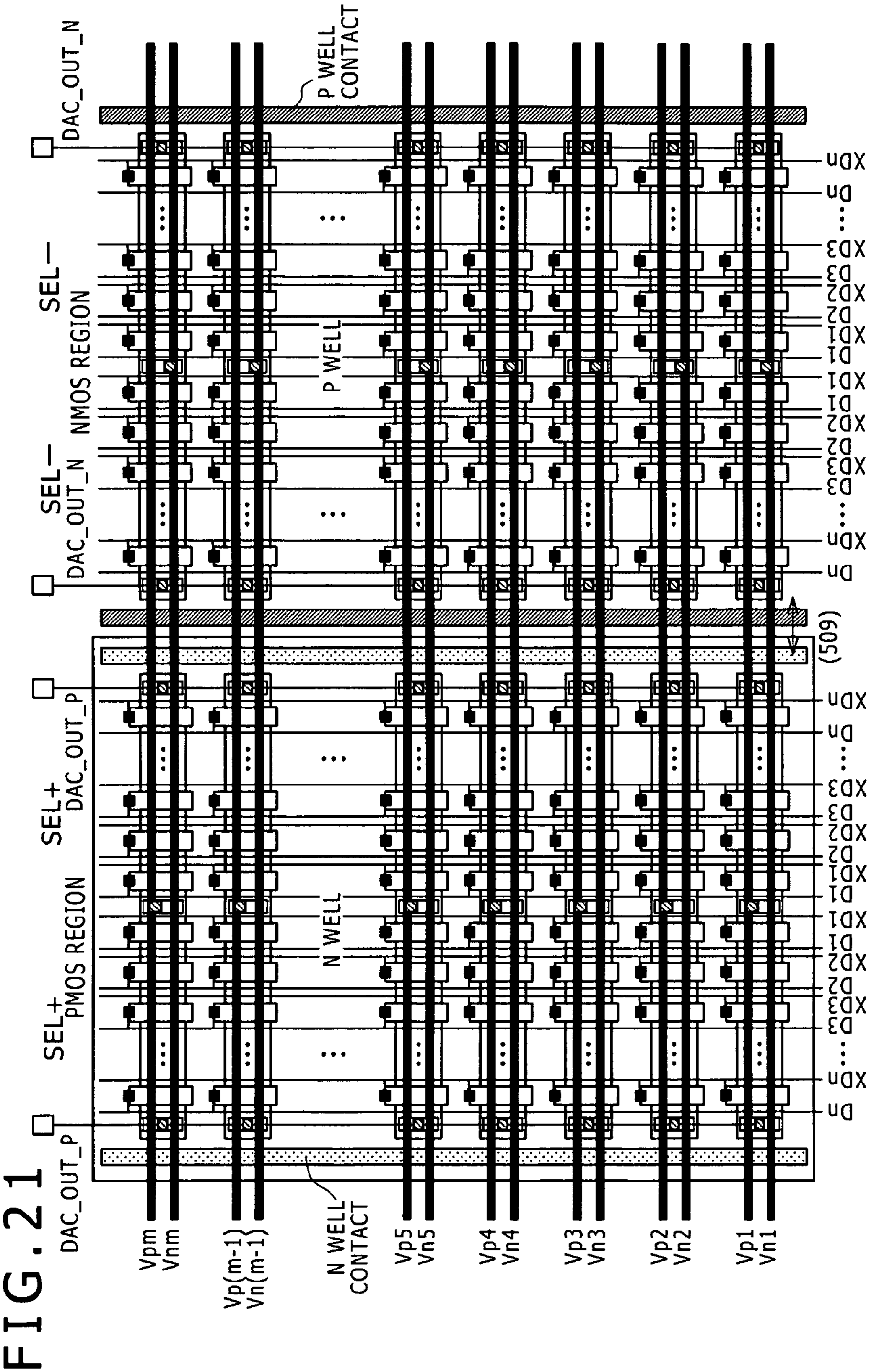
FIG. 21 is a diagram specifically illustrating the layout and configuration of selectors according to a comparative example.

FIG. 21 is a diagram specifically illustrating the layout and configuration of selectors according to a comparative example.

Figure 22:
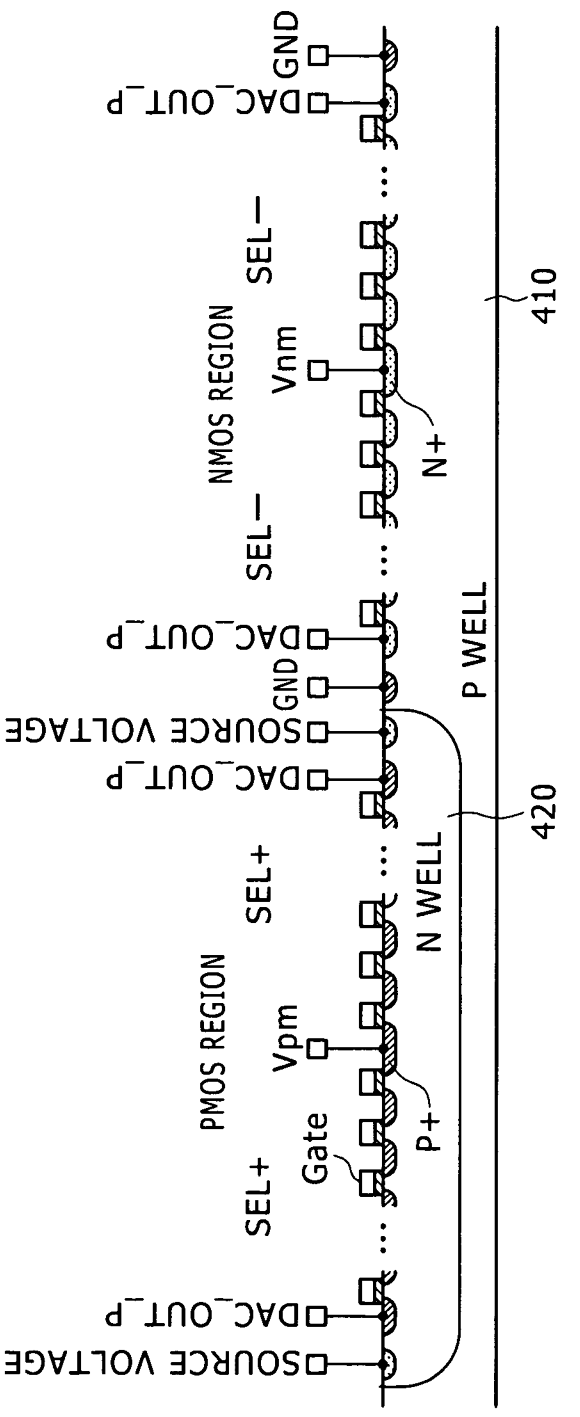
FIG. 22 is a diagram illustrating a simplified vertical cross-sectional structure of the selectors according to the comparative example.

FIG. 22 is a diagram illustrating a simplified vertical cross-sectional structure of the selectors according to the comparative example.

[Advantageous Effects of the Unit Used for Repeated Arrangement]

As illustrated in FIG. 13 and FIGS. 17 to 20, when we focus our attention on the arrangement of the positive and negative selectors SEL+ and SEL− in the layout according to the present embodiment, the selectors of the same polarity are arranged side by side repeatedly.

Therefore, the positive selectors SEL+ are formed solely by PMOS transistors that are formed in an N well 420 provided in a P well 410 as illustrated in FIG. 18.

The negative selectors SEL− are formed solely by NMOS transistors that are formed in the P well 410 as illustrated in FIG. 20.

That is, the present embodiment eliminates regions for isolating PMOS and NMOS transistors.

That is, the present embodiment provides reduction in width per channel by the well isolation distance as compared to the layout according to the comparative example.

Further, the output voltage wires LVP of the same polarity from the positive register string pass above the positive selectors SEL+. Similarly, the output voltage wires LVN of the same polarity from the negative register string pass above the negative selectors SEL−.

Therefore, even if the transistors are reduced in size, it is possible to readily pass the output voltage wires LVP and LVN from the register strings, thus providing smaller 'wires only' portions than the comparative example.

The present embodiment allows for the layout of units at the same unit height as the comparative example and permits the output wires to be drawn out from the top and bottom sides.

[Advantageous Effects of the Component Layout As a Whole]

The present embodiment allows for the layout of units at the same height as the single-stage configuration according to the comparative example, and yet has the output wires drawn out from the top and bottom sides. Therefore, it is possible to reduce the routed wires 42 shown in FIG. 4, a problem with the existing techniques, by arranging output pads at the top and bottom sides of the chip.

Further, a rectangular shape can be maintained, thus making it possible to secure a perimeter long enough to arrange pads. This provides reduced overall chip area.

A description has been given of the above embodiment by taking, as an example, a case in which the present invention is applied to an active matrix liquid crystal display device. However, the present invention is not limited thereto. The present invention is similarly applicable to other types of active matrix display devices such as electroluminescence (EL) display devices using EL elements as electro-optical elements of the pixels.

<5. Configuration Examples of Electronic Apparatus>

Further, active matrix liquid crystal display devices typified by that according to the above-described embodiment are applicable to various electronic apparatuses.

That is, the active matrix display device is applicable as a display device of electronic apparatuses used across all disciplines to display an image or video of a video signal fed to or generated inside the electronic apparatus.

It should be noted that among examples of such electronic apparatus are digital cameras, laptop personal computers, mobile terminal devices such as mobile phone, desktop personal computers and video camcorders.

Examples of electronic apparatus to which the present embodiment is applied will be described below.

Figure 23:
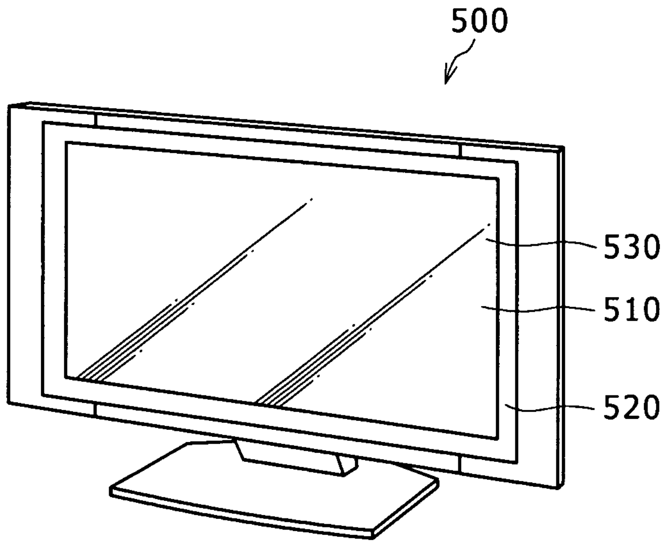
FIG. 23 is a perspective view illustrating a television set to which the present embodiment is applied.

FIG. 23 is a perspective view illustrating a television set to which the present embodiment is applied.

A television set 500 according to the present application example includes a video display screen section 510 made up of a front panel 520, filter glass 530 and other parts. The television set 500 is manufactured by using the display device according to the present embodiment as the video display screen section 510.

Figure 24A:
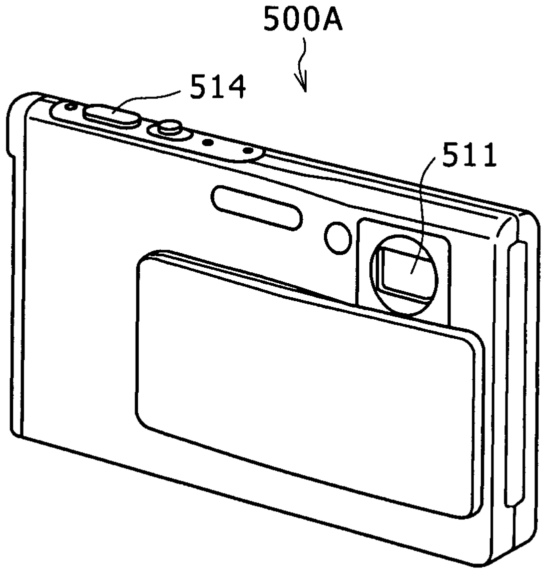
FIGS. 24A and 24B are perspective views illustrating a digital camera to which the present embodiment is applied.
Figure 24B:
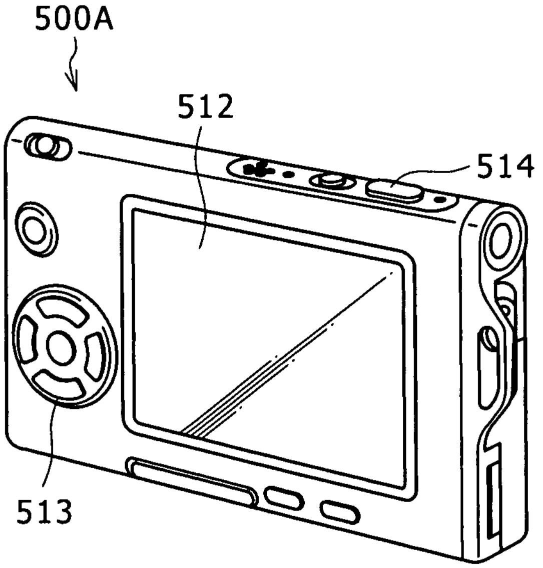

FIGS. 24A and 24B are perspective views illustrating a digital camera to which the present embodiment is applied. FIG. 24A is a front view, and FIG. 24B a rear view.

A digital camera 500A according to the present application example includes a flash-emitting section 511, display section 512, menu switch 513, shutter button 514 and other parts. The digital camera 500A is manufactured by using the display device according to the present embodiment as the display section 512.

Figure 25:
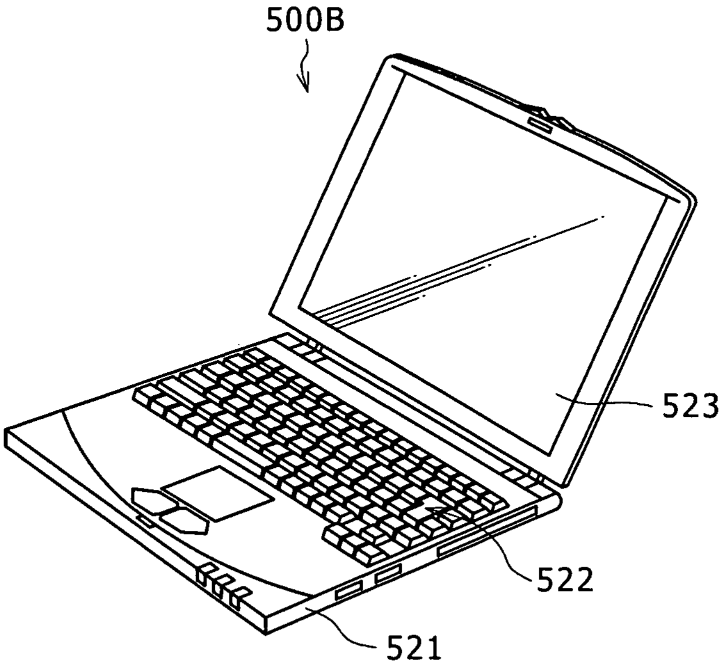
FIG. 25 is a perspective view illustrating a laptop personal computer to which the present embodiment is applied.

FIG. 25 is a perspective view illustrating a laptop personal computer to which the present embodiment is applied.

A laptop personal computer 500B according to the present application example includes a keyboard 522 adapted to be manipulated for entry of text or other information, a display section 523 adapted to display an image and other parts in a main body 521. The laptop personal computer 500B is manufactured by using the display device according to the present embodiment as the display section 523.

Figure 26:
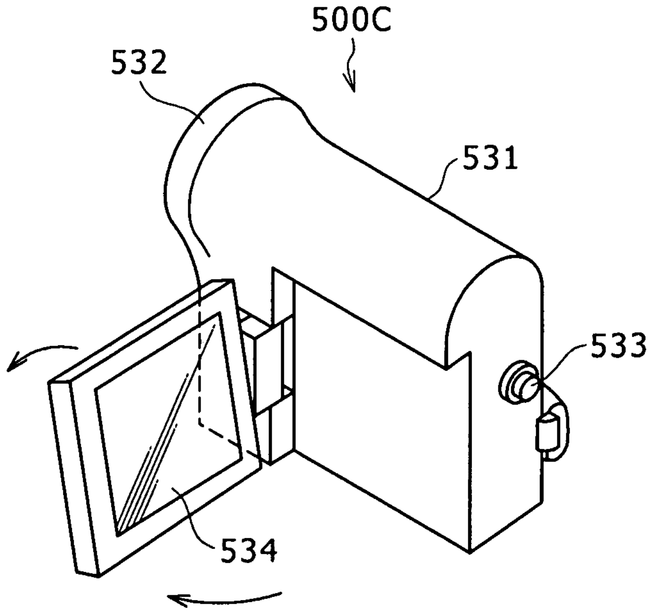
FIG. 26 is a perspective view illustrating a video camcorder to which the present embodiment is applied.

FIG. 26 is a perspective view illustrating a video camcorder to which the present embodiment is applied.

A video camcorder 500C according to the present application example includes a main body section 531, lens 532 provided on the front-facing side surface to capture the image of the subject, imaging start/stop switch 533, display section 534 and other parts. The video camcorder 500C is manufactured by using the display device according to the present embodiment as the display section 534.

FIGS. 27A to 27G are views illustrating a mobile terminal device such as mobile phone to which the present embodiment is applied.

Figures 27A, 27B, 27C, 27D, 27E, 27F, 27G:
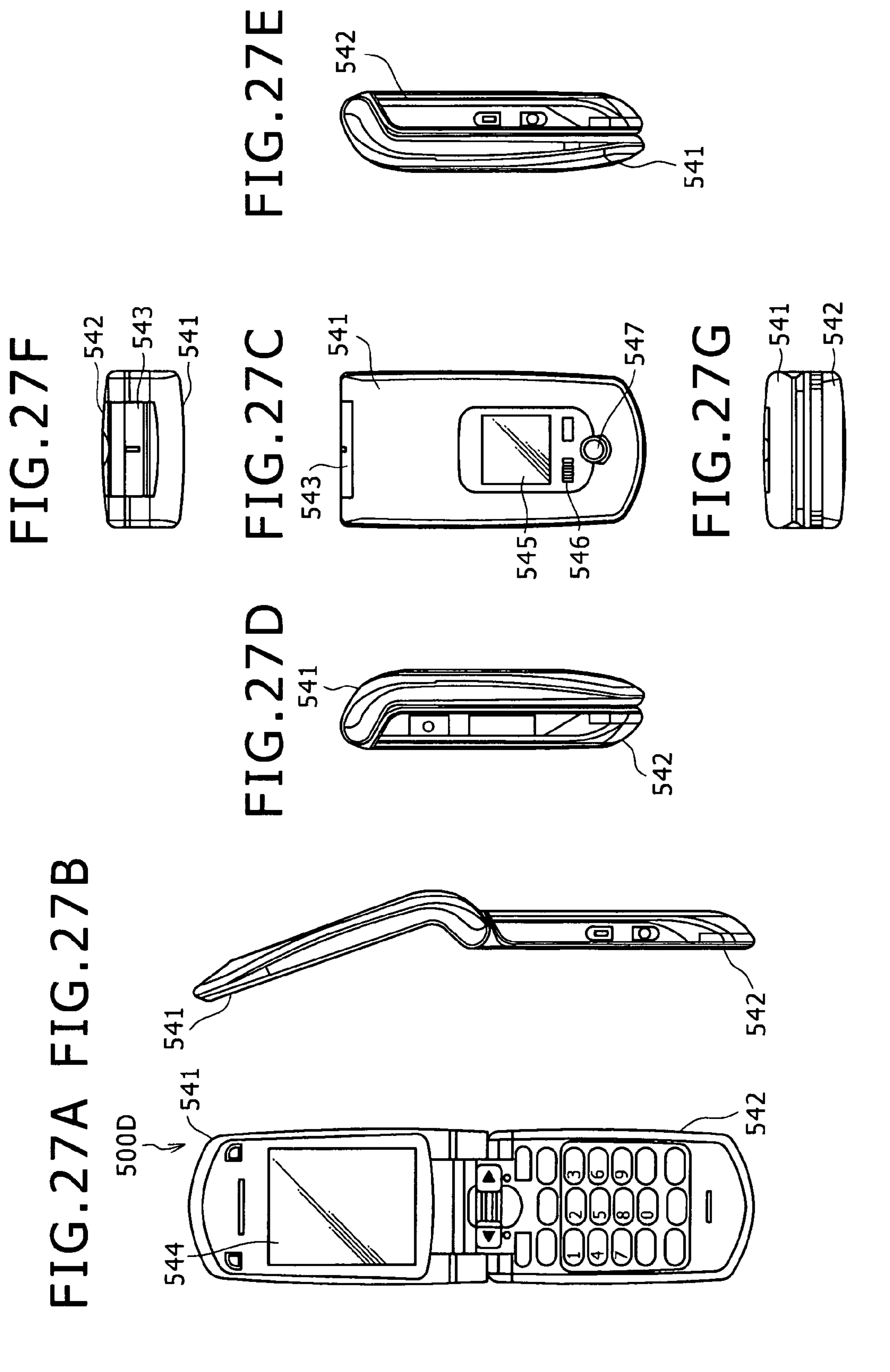
FIGS. 27A to 27G are perspective views illustrating a mobile terminal such as mobile phone to which the present embodiment is applied.

FIG. 27A is a front view in an open position, FIG. 27B a side view thereof, FIG. 27C a front view in a closed position, FIG. 27D a left side view, FIG. 27E a right side view, FIG. 27F a top view, and FIG. 27G a bottom view.

A mobile phone 500D according to the present application example includes an upper enclosure 541, lower enclosure 542, connecting section (hinge section in this example) 543, display 544, subdisplay 545, picture light 546, camera 547 and other parts.

The mobile phone 500D is manufactured by using the display device according to the present embodiment as the display 544 and subdisplay 545.

The present application contains subject matter related to that disclosed in Japanese Priority Patent Application JP 2009-272724 filed in the Japan Patent Office on Nov. 30, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A signal line drive circuit comprising:

a positive voltage supply section adapted to supply a plurality of positive voltages;

a negative voltage supply section adapted to supply a plurality of negative voltages;

positive and negative line buffers arranged on a first axis and adapted to respectively distribute input digital signals to a positive and a negative selector, respectively;

the positive selector adapted to select a voltage level from among a plurality of voltage levels supplied from the positive voltage supply section according to the digital signal supplied from one of the line buffers;

the negative selector adapted to select a voltage level from among a plurality of voltage levels supplied from the negative voltage supply section according to the digital signal supplied from one of the line buffers; and an output selector which can switch the voltages selected by the positive and negative selectors between positive and negative levels for output to signal lines, wherein the positive selector and the negative selector are symmetrically arranged with respect to the first axis, and wherein the positive and negative line buffers are alternately arranged along the first axis and between the positive selector and the negative selector.

2. The signal line drive circuit of claim 1 comprising:

a positive level shifter adapted to change the level of a digital signal from the line buffer and supply the digital signal to the positive selector; and a negative level shifter adapted to change the level of a digital signal from the line buffer and supply the digital signal to the negative selector, wherein the positive level shifter is arranged between the line buffers and the positive selector, and wherein the negative level shifter is arranged between the line buffers and the negative selector.

3. The signal line drive circuit of claim 1 comprising:

a positive buffer amplifier adapted to amplify a signal output from the positive selector; and a negative buffer amplifier adapted to amplify a signal output from the negative selector, wherein the positive buffer amplifier is arranged on a side of the positive selector opposite to the line buffers, the negative buffer amplifier is arranged on a side of the negative selector opposite to the line buffers, the output selector is arranged on a side of the positive buffer amplifier opposite to the positive selector or on a side of the negative buffer amplifier opposite to the negative selector, and the outputs of the positive and negative buffer amplifiers are connected to an input of the output selector.

4. The signal line drive circuit of claim 1, wherein the output selector is formed to include an output switching amplifier, the output selector is arranged on a side of the positive selector opposite to the line buffers or on a side of the negative selector opposite to that opposed to the line buffers, and the outputs of the positive and negative buffer amplifiers are connected to an input of the output selector.

5. The signal line drive circuit of claim 1, wherein the output selector is arranged on a side of the positive selector opposite to the line buffers or on a side of the negative selector opposite to the line buffers, the outputs of the positive and negative selectors are connected to an input of the output selector, and buffer amplifiers associated with positive and negative signals are arranged on a side of the output selector opposite to the positive selector or on a side of the output selector opposite to the negative selector.

6. The signal line drive circuit of claim 1, wherein the signal line drive circuit is one of a plurality of signal line drive circuits arranged in parallel and, in a plurality of columns adjacent to each other to form a multi-channel unit.

7. The signal line drive circuit of claim 6, wherein the multi-channel unit is one of a plurality of multi-channel units arranged in parallel.

8. The signal line drive circuit of claim 1, wherein the positive and negative selectors are arranged on a second axis that is perpendicular to the first axis.

9. The signal line drive circuit of claim 1, wherein the symmetrical arrangement of the positive and negative selectors includes the positive selector is on a first side of the line buffers and the negative selector is on a second side of the line buffers perpendicular to the first axis.

10. The signal line drive circuit of claim 1, wherein the first axis is a center point of the symmetrical arrangement of the positive and negative selectors.

11. The signal line drive circuit of claim 1, further comprising:

positive and negative level shifters respectively arranged between the line buffers and the positive and negative selectors; and positive and negative buffer amplifiers respectively arranged on a side of the positive selector opposite to the line buffers.

12. A display device comprising:

a display section having display cells arranged in a matrix form, the display cells being driven by reversing the polarity; and signal line drive circuits each of which supplies a positive or negative signal voltage to each of signal lines connected to the display cells in response to the polarity reversal, wherein each of the signal line drive circuits includes:

a positive voltage supply section adapted to supply a plurality of positive voltages, a negative voltage supply section adapted to supply a plurality of negative voltages, positive and negative line buffers arranged on a first axis and adapted to respectively distribute input digital signals to a positive and a negative selector, respectively, the positive selector adapted to select a voltage level from among a plurality of voltage levels supplied from the positive voltage supply section according to the digital signal supplied from one of the line buffers, the negative selector adapted to select a voltage level from among a plurality of voltage levels supplied from the negative voltage supply section according to the digital signal supplied from one of the line buffers, and an output selector which can switch the voltages selected by the positive and negative selectors between positive and negative levels for output to signal lines, wherein the positive selector and the negative selector are symmetrically arranged with respect to the first axis, and wherein the positive and negative line buffers are alternately arranged along the first axis and between the positive selector and the negative selector.

13. The display device of claim 12 comprising:

a positive level shifter adapted to change the level of a digital signal from the line buffer and supply the digital signal to the positive selector; and a negative level shifter adapted to change the level of a digital signal from the line buffer and supply the digital signal to the negative selector, wherein the positive level shifter is arranged between the line buffers and the positive selector, and wherein the negative level shifter is arranged between the line buffers and the negative selector.

14. The display device of claim 12 comprising:

a positive buffer amplifier adapted to amplify a signal output from the positive selector; and a negative buffer amplifier adapted to amplify a signal output from the negative selector, wherein the positive buffer amplifier is arranged on a side of the positive selector opposite to the line buffers, the negative buffer amplifier is arranged on a side of the negative selector opposite to the line buffers, the output selector is arranged on a side of the positive buffer amplifier opposite to the positive selector or on a side of the negative buffer amplifier opposite to the negative selector, and the outputs of the positive and negative buffer amplifiers are connected to an input of the output selector.

15. The display device of claim 12, wherein the output selector is formed to include an output switching amplifier, the output selector is arranged on a side of the positive selector opposite to the line buffers or on a side of the negative selector opposite to the line buffers, and the outputs of the positive and negative buffer amplifiers are connected to an input of the output selector.

16. The display device of claim 12, wherein the output selector is arranged on a side of the positive selector opposite to the line buffers or on a side of the negative selector opposite to the line buffers, the outputs of the positive and negative selectors are connected to an input of the output selector, and buffer amplifiers associated with positive and negative signals are arranged on a side of the output selector opposite to the positive selector or on a side of the output selector opposite to the negative selector.

17. The display device of claim 12, wherein the plurality of signal line drive circuits are arranged in parallel and in a plurality of columns adjacent to each other to form a multi-channel unit.

18. The display device of claim 17, wherein the plurality of multi-channel units are arranged in parallel.

19. An electronic apparatus having a display device, the display device comprising:

a display section having display cells arranged in a matrix form, the display cells being driven by reversing the polarity; and signal line drive circuits each of which supplies a positive or negative signal voltage to each of signal lines connected to the display cells in response to the polarity reversal, wherein each of the signal line drive circuits includes:

a positive voltage supply section adapted to supply a plurality of positive voltages, a negative voltage supply section adapted to supply a plurality of negative voltages, positive and negative line buffers arranged on a first axis and adapted to respectively distribute input digital signals to a positive and a negative selector, respectively, the positive selector adapted to select a voltage level from among a plurality of voltage levels supplied from the positive voltage supply section according to the digital signal supplied from one of the line buffers, the negative selector adapted to select a voltage level from among a plurality of voltage levels supplied from the negative voltage supply section according to the digital signal supplied from one of the line buffers, and an output selector which can switch the voltages selected by the positive and negative selectors between positive and negative levels for output to signal lines, and wherein the positive selector and the negative selector are symmetrically arranged with respect to the first axis, and wherein the positive and negative line buffers are alternately arranged along the first axis and between the positive selector and the negative selector.

* * * * *